United States Patent
Chen et al.

(10) Patent No.: US 9,361,986 B2
(45) Date of Patent: Jun. 7, 2016

(54) HIGH ENDURANCE NON-VOLATILE STORAGE

(71) Applicant: SANDISK TECHNOLOGIES INC., Plano, TX (US)

(72) Inventors: Jian Chen, San Jose, CA (US); Sergei Gorobets, Edinburgh (GB); Steven Sprouse, San Jose, CA (US); Tien-Chien Kuo, Sunnyvale, CA (US); Yan Li, Milpitas, CA (US); Seungpil Lee, San Ramon, CA (US); Alex Mak, Los Altos, CA (US); Deepanshu Dutta, Santa Clara, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 493 days.

(21) Appl. No.: 13/622,045

(22) Filed: Sep. 18, 2012

(65) Prior Publication Data

US 2013/0070530 A1     Mar. 21, 2013

Related U.S. Application Data

(60) Provisional application No. 61/536,555, filed on Sep. 19, 2011.

(51) Int. Cl.
*G11C 16/10* (2006.01)
*G11C 5/06* (2006.01)
*G11C 11/56* (2006.01)

(52) U.S. Cl.
CPC ................. *G11C 16/10* (2013.01); *G11C 5/063* (2013.01); *G11C 11/5628* (2013.01); *G11C 2211/5641* (2013.01)

(58) Field of Classification Search
CPC ........... G11C 11/5628; G11C 11/5621; G11C 2211/5641; G11C 16/0483; G11C 11/40622
See application file for complete search history.

(56) References Cited

U.S. PATENT DOCUMENTS

| | | | |
|---|---|---|---|
| 5,192,872 A * | 3/1993 | Lee ............................... 257/315 |
| 5,332,917 A | 7/1994 | Lee |
| 5,796,295 A * | 8/1998 | Sharpe-Geisler ...... G11C 5/147 327/541 |
| 6,166,959 A | 12/2000 | Gupta |
| 6,982,907 B1 | 1/2006 | Mirgorodski |
| 7,283,393 B2 | 10/2007 | Song |
| 7,477,547 B2 | 1/2009 | Lin |
| 7,760,547 B2 | 7/2010 | Lutze |
| 7,953,931 B2 | 5/2011 | Yu |
| 8,243,525 B1 * | 8/2012 | Kan ......................... 365/185.25 |
| 2002/0005544 A1 * | 1/2002 | Fujiwara ............ G11C 16/0425 257/314 |
| 2003/0026132 A1 * | 2/2003 | Chen et al. ............... 365/185.18 |
| 2005/0036353 A1 * | 2/2005 | Sugimae ............... H01L 27/115 365/123 |
| 2005/0237808 A1 | 10/2005 | Ichikawa |
| 2007/0285980 A1 * | 12/2007 | Shimizu et al. .......... 365/185.03 |
| 2008/0012060 A1 * | 1/2008 | Ding et al. .................... 257/314 |
| 2008/0083946 A1 * | 4/2008 | Fang et al. .................... 257/324 |

(Continued)

OTHER PUBLICATIONS

PCT International Search Report mailed Apr. 19, 2013, PCT Patent Application No. PCT/2012/055919.

(Continued)

*Primary Examiner* — Douglas King
(74) *Attorney, Agent, or Firm* — Vierra Magen Marcus LLP

(57) ABSTRACT

A non-volatile storage system is disclosed that includes non-volatile memory cells designed for high endurance and lower retention than other non-volatile memory cells.

21 Claims, 32 Drawing Sheets

(56) References Cited

U.S. PATENT DOCUMENTS

| | | | |
|---|---|---|---|
| 2008/0121966 A1* | 5/2008 | Muralidhar | B82Y 10/00 |
| | | | 257/315 |
| 2008/0128786 A1* | 6/2008 | Kim et al. | 257/321 |
| 2008/0158969 A1 | 7/2008 | Moogat | |
| 2009/0172267 A1* | 7/2009 | Oribe et al. | 711/103 |
| 2009/0175079 A1* | 7/2009 | Wang | G11C 16/26 |
| | | | 365/185.03 |
| 2010/0110798 A1* | 5/2010 | Hoei et al. | 365/185.24 |
| 2010/0172180 A1 | 7/2010 | Paley | |
| 2010/0246257 A1 | 9/2010 | Ito | |
| 2011/0161571 A1* | 6/2011 | Kim et al. | 711/103 |
| 2011/0302476 A1* | 12/2011 | Lee et al. | 714/763 |
| 2012/0278529 A1* | 11/2012 | Hars | G06F 12/0246 |
| | | | 711/103 |

OTHER PUBLICATIONS

Partial International Search Report dated Feb. 14, 2013, PCT Patent Application No. PCT/2012/055919.

Pan, "Novel-Self-Convergent Programming Method Using Source-Induced Band-to-Band Hot Electron Injection," IEEE Electron Device Letters, vol. 23, No. 11, Nov. 2002, pp. 652-654.

* cited by examiner

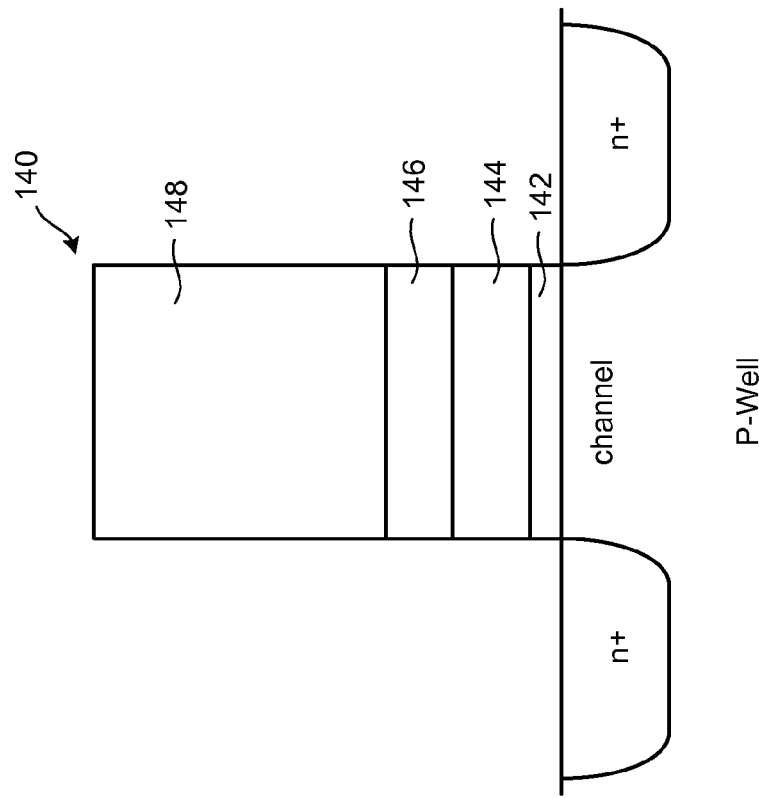
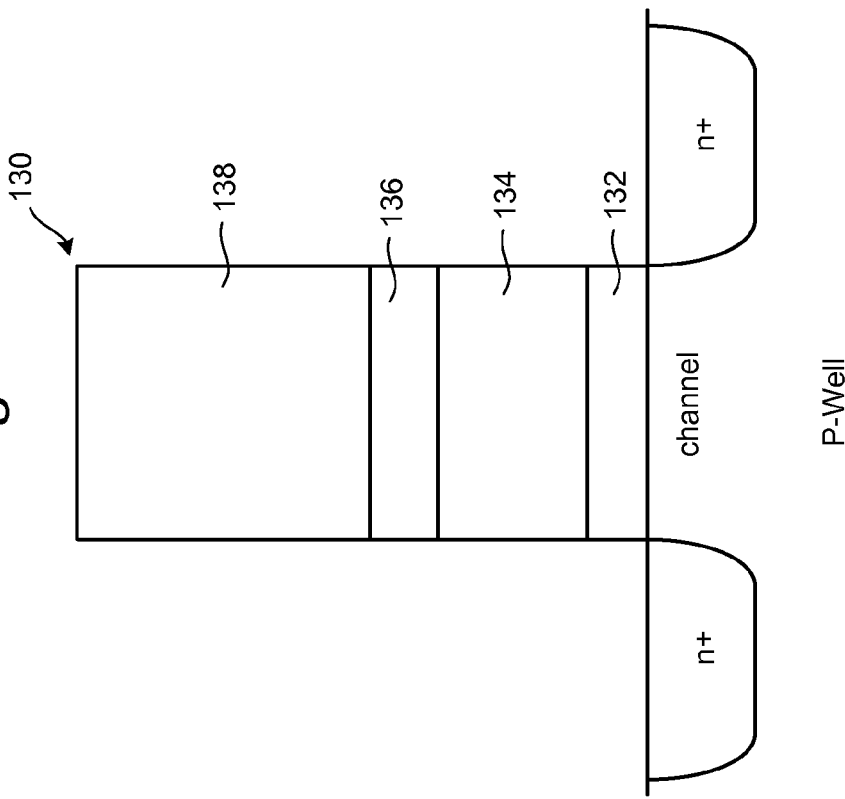

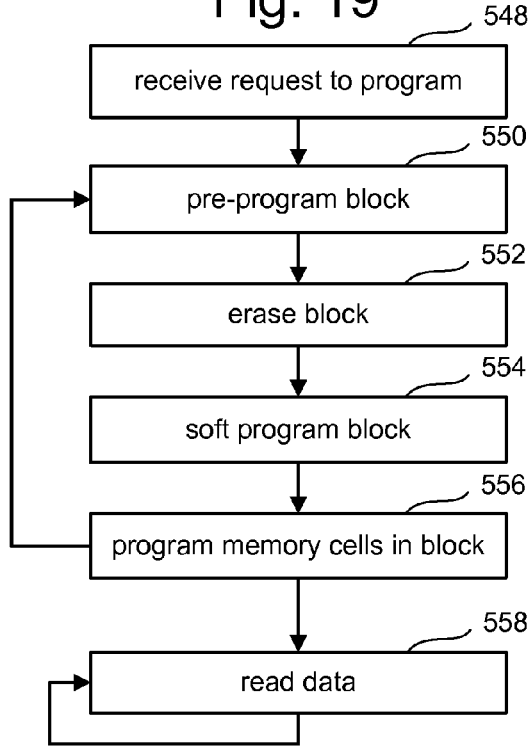
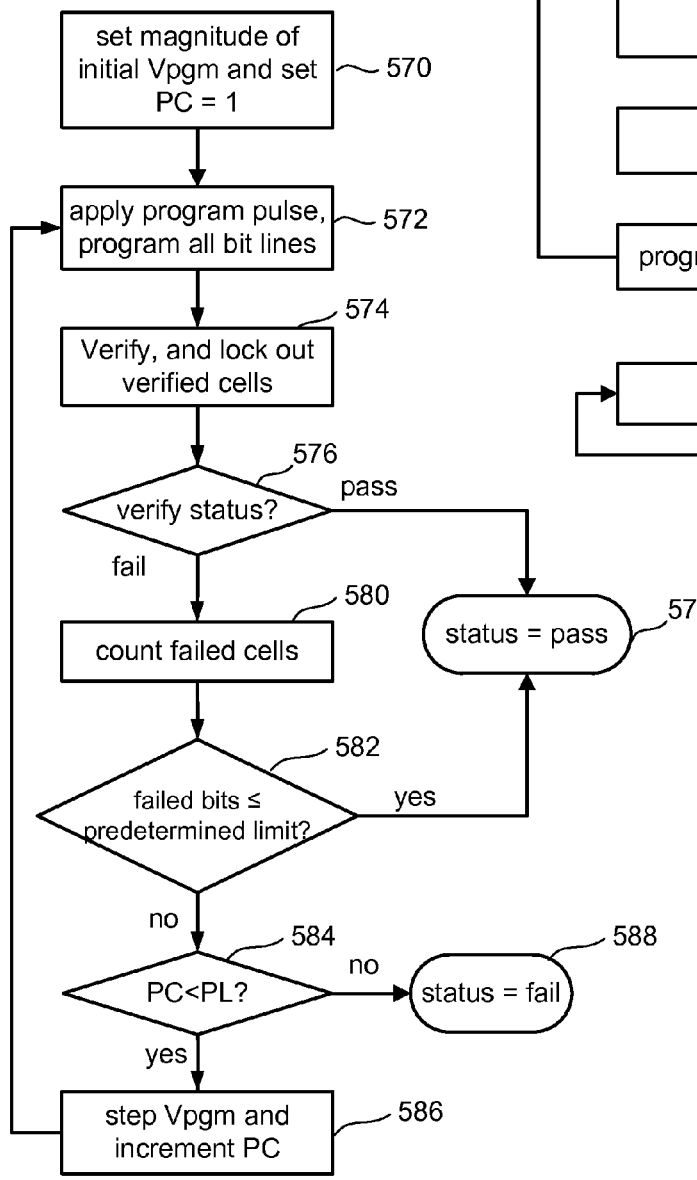

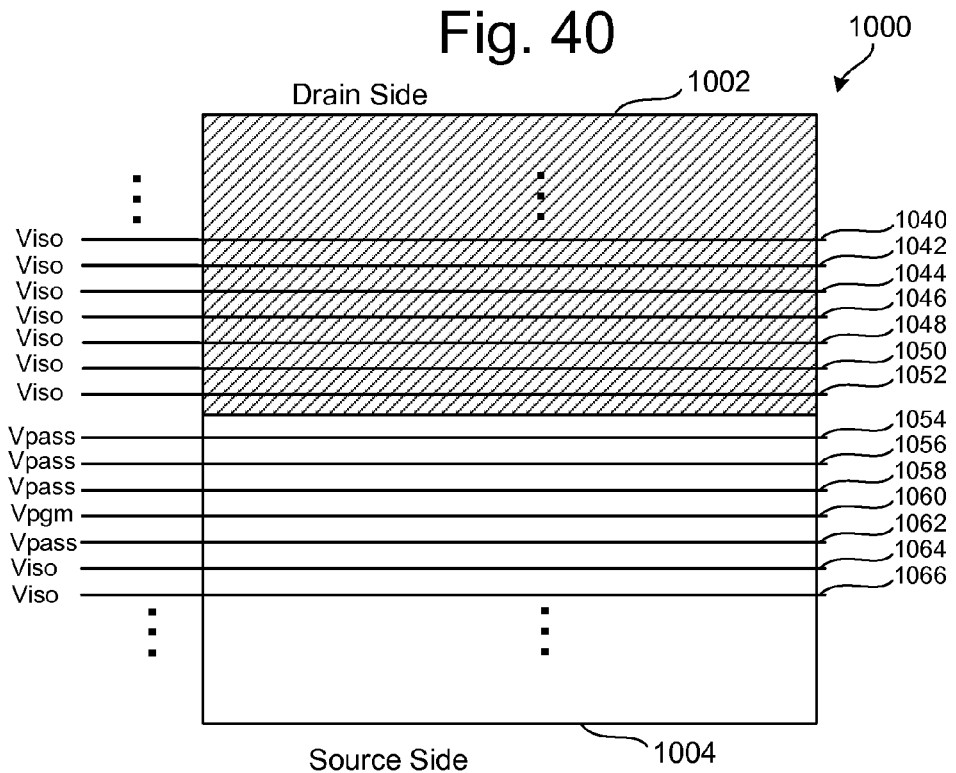
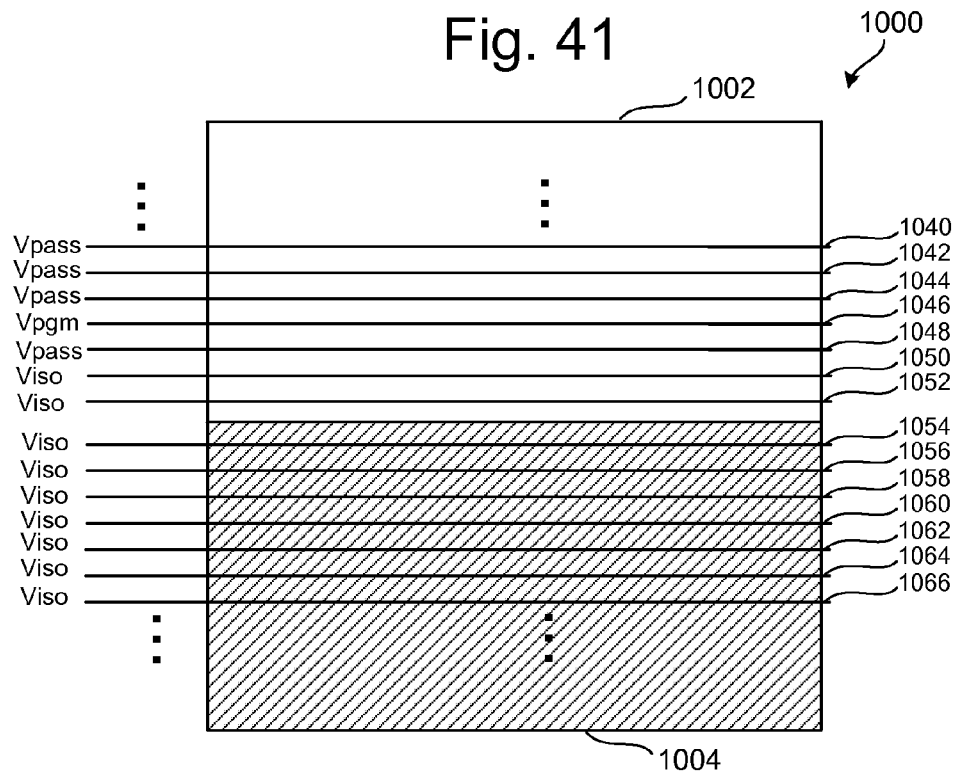

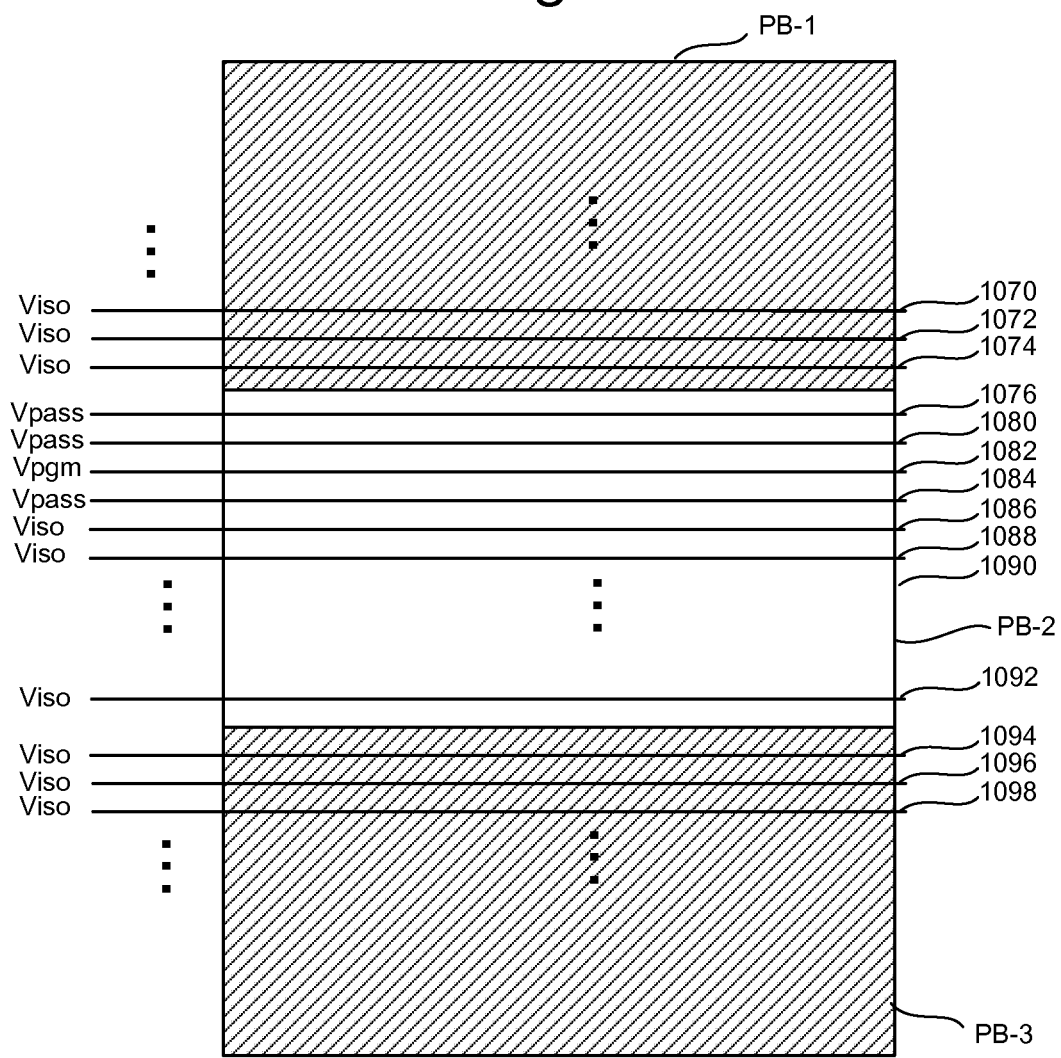

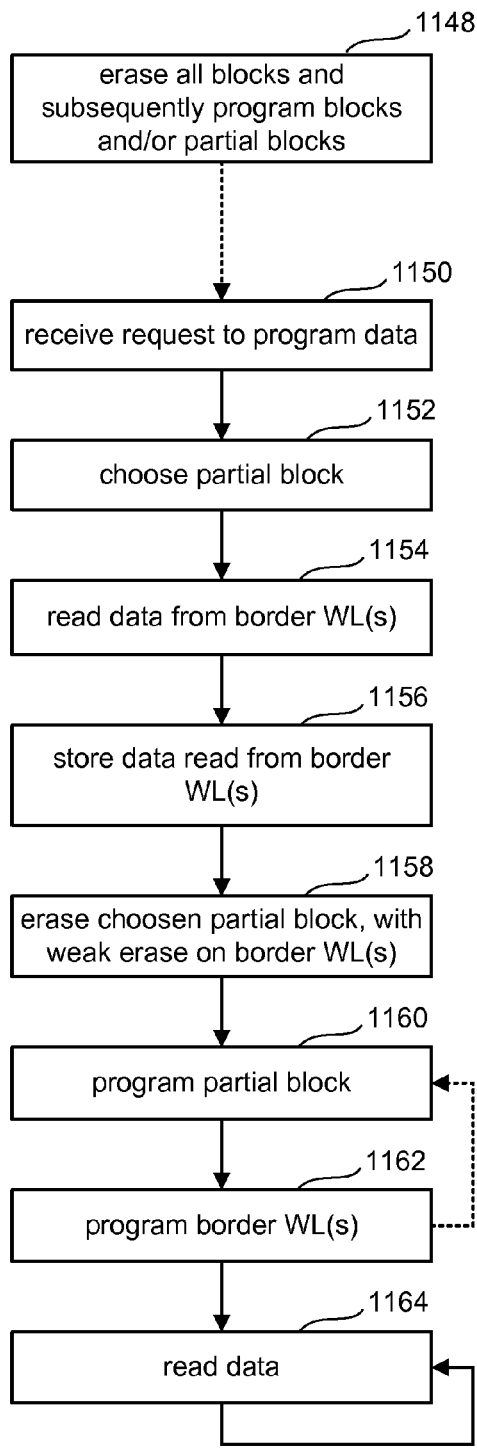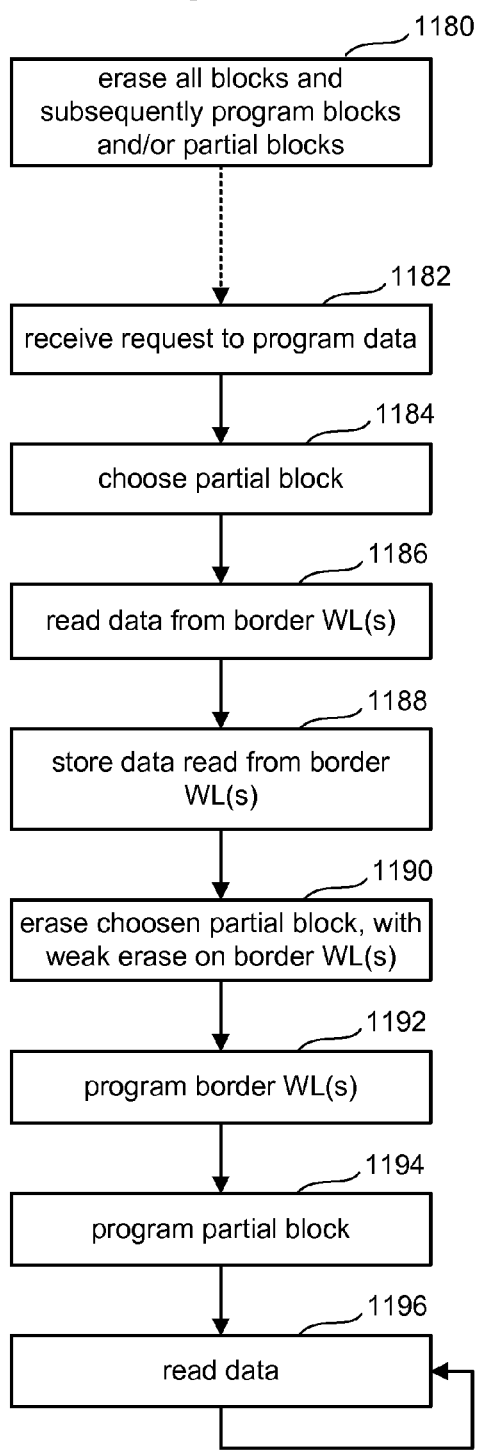

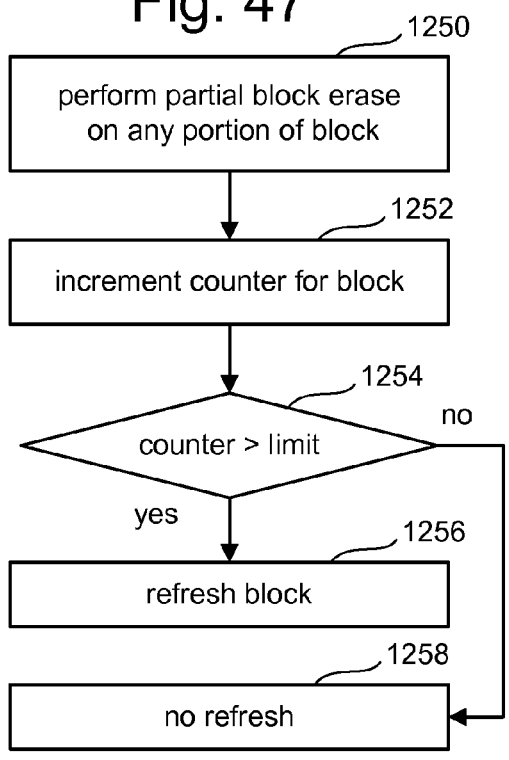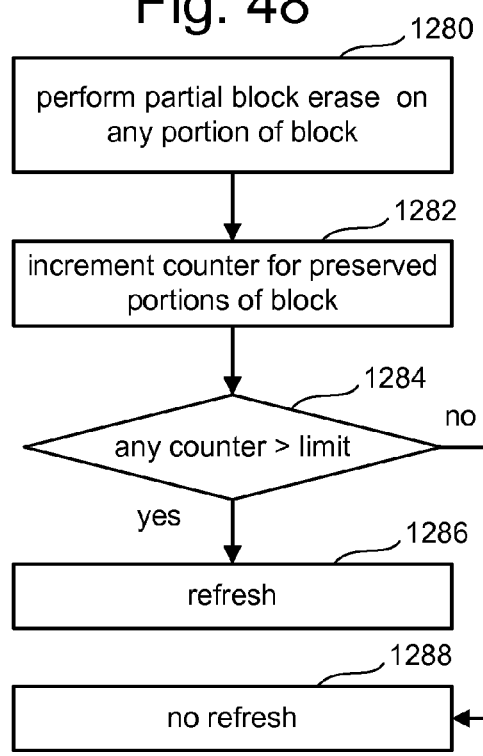

HIGH ENDURANCE NON-VOLATILE STORAGE

This patent application claims priority to U.S. Provisional Application 61/536,555, "High Endurance Non-Volatile Storage," filed on Sep. 19, 2011.

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned above a channel region and between source and drain regions. The floating gate is separated from the channel region by a layer of a dielectric. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons (charge) from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory device is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

Some issues faced by non-volatile storage, including flash memory, include data retention and endurance. Data retention refers to how long data will remain stored accurately in the memory device. A memory device with long data retention will maintain data stored in an accurate manner for a long time (e.g., 10 years). A memory device with shorter data retention will maintain data stored in an accurate manner for a shorter times, such as weeks or months (or other time period).

Endurance refers to the ability to continue operating accurately after many cycles of writing and erasing (or re-writing). A memory device with high endurance will continue to operate effectively after tens of thousands of cycles. A memory device with low endurance can only be written hundreds (or in some cases thousands) of times before the device starts to suffer a degradation in performance.

BRIEF DESCRIPTION OF THE DRAWINGS

FIG. 3 depicts a cross section of a memory cell.

FIG. 4 depicts a cross section of a memory cell.

FIG. 19 is a flow chart describing one embodiment of a process for operating non-volatile memory.

FIG. 20 is a flow chart describing one embodiment of a process for programming non-volatile memory.

FIG. 40 is a block diagram depicting a portion of a memory array.

FIG. 41 is a block diagram depicting a portion of a memory array.

FIG. 42 is a block diagram depicting a portion of a memory array.

FIGS. 45 and 46 are flow charts depicting two embodiments of processes that perform partial memory erase/programming, including reading out the border word lines prior to such an operation.

FIGS. 47 and 48 are flowcharts that describe two embodiments of processes for determining whether it is time to refresh a block for systems that use partial block erase.

DETAILED DESCRIPTION

Figure 1:
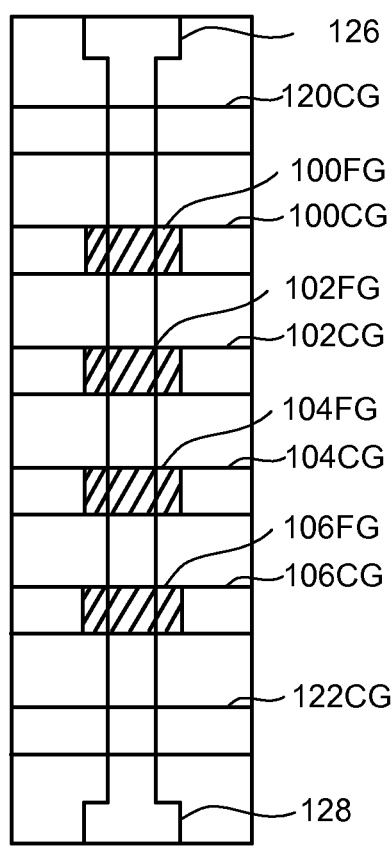
FIG. 1 is a top view of a NAND string.

In many circumstances, designing memory can require compromises. For example, some memory devices may be optimized for long data retention at the expense of lower endurance (referred to as Low Endurance Long Retention memory) while other memory devices may be optimized for high endurance at the expense of shorter data retention (referred to as High Endurance Short Retention memory). Many non-volatile memory systems commercially available are Low Endurance Long Retention memory devices that are designed so that they will maintain the user's data for a long time. To guarantee the long data retention, certain design decisions are made for the memory devices that result in slower performance and lower data density.

There are uses and circumstances where data does not need to persist for many years, therefore, using memory devices with long data retention in those situations may not be necessary, such as when used in a Cache system. Technology is proposed herein for a High Endurance Short Retention non-volatile memory that is optimized for high performance, with the understanding that data retention will not be as long as other non-volatile memory. In traditional flash memory, the data retention is in the range of 10 years to at least 1 year, while the traditional DRAM have data retention of a few milliseconds. The proposed technology introduce a class of memory that have data retention in between of these two extremes.

Saturated Memory Cell

One embodiment of a High Endurance Short Retention non-volatile memory includes memory cells with smaller floating gates. For example, the floating gates may be shorter or thinner. By having a smaller floating gate, the floating gate will be able to absorb a smaller amount of charge during program operations.

Traditionally, smaller floating gates are avoided because limiting the charge on the floating gate will limit the increase in threshold voltage that can be achieved during programming. To increase memory density, many non-volatile storage systems implement multi-state memory devices. By having each memory cell store multiple bits of data, more data is stored per unit area of substrate. To store multiple bits of data, the memory cell needs to be able to implement multiple, distinct allowed threshold voltage ranges, which requires that the threshold voltage can be raised to a significantly high voltage. Therefore, in one embodiment, the proposed High Endurance Short Retention memory cell will have a smaller floating gate and store binary data (two states—erased and programmed). As the memory cells is only storing binary data (as opposed to multi-state data), there is no need for the higher threshold voltages required by multi-state data. Since programming will only raise the threshold voltage by a smaller amount than multi-state memory cells, the time needed for programming will decrease.

One property of a smaller floating gate is that it will saturate at a lower amount of charge than a larger floating gate. This is a property that has not been acceptable for multi-state memory cells as they need to implement multiple narrow threshold voltage distributions. However, the High Endurance Short Retention memory cell storing binary data can take advantage of the lower saturation level.

In many embodiments, the program voltage is applied to the word line as a series of pulses, with each successive pulse being higher in magnitude than a previous pulse by a step size. Between each pulse, a set of one or more verify operations are performed to determine whether the programming has completed by testing whether the memory cells are in the appropriate data states. However, it is proposed to further shorten the time needed for programming by applying a small number of programming pulses without all or some of the intervening verify operations. The magnitude and width of the programming pulses are designed such that after the programming pulses all, almost all, or a large percentage of the memory cells being programmed have their floating gate saturated with electrons. That is, the amount of programming applied to the selected memory cells is more than needed to move the threshold voltage to the programmed state. Therefore, many memory cells will have the amount of charge on the floating gate reach a saturation point before programming is completed. This results in a narrow threshold voltage distribution and allows for the programming to be performed without verifying between programming pulses. In some embodiments, a verification operation can be performed after all of the programming pulses have been applied to insure that the data was written correctly. Note that because the floating gates reach saturation, over programming is not a problem.

In one embodiment, rather than using a smaller floating gate, nanodots can be used in the floating gate to limit the amount of charge that is added to the floating gate during programming. More information about nanodots can be found in U.S. Patent Application 2009/0155967, "Method of Forming Memory With Floating Gates Including Self-Aligned Metal Nanodots Using a Coupling Layer," filed on Dec. 18, 2007 and U.S. Patent Application 2011/0020992, "Integrated Nonostructure-Based Non-Volatile Memory Fabrication," filed on Jul. 20, 2010; and U.S. Patent Application, both of which are incorporated herein by reference in their entirety.

In one embodiment, the High Endurance Short Retention memory cell storing binary data can also utilize a thinner dielectric between the floating gate and the channel area. The thinner dielectric allows the programming operation to proceed quicker, as it is easier for charge to pass through the dielectric to the floating gate. The thinner dielectric and the thinner floating gate also allow for lower program voltages to be used, which saves power. The smaller dielectric and smaller floating gate will also result in a smaller memory cell (which reduces area per memory cell).

Figure 2:
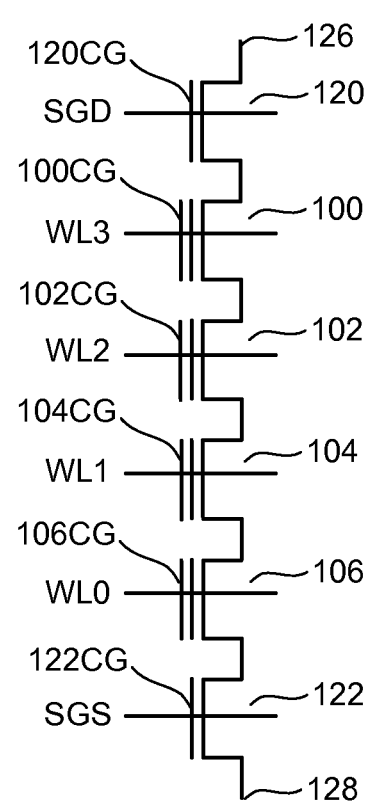
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. Patents/Patent Applications, all of which are incorporated herein by reference in their entirety: U.S. Pat. Nos. 5,570,315; 5,774,397; 6,046,935; 6,456,528; and U.S. Pat. Publication No. US2003/0002348.

FIG. 3 is a cross section of one embodiment of a memory cell 130 on a NAND string (e.g., such as any of the memory cells depicted in FIGS. 1 and 2). In some embodiments, the memory system is implemented on a p type of substrate. Within the p substrate will be an n-well. Within the n-well are one or more p-wells. The NAND strings are implemented in the p-wells FIG. 3 shows a p-well, but does not show the n-well or underlying p substrate. N+ diffusion regions, serving as the source and drain, are located in the p-well. The area in the p-well between the N+ diffusion regions is the channel. Above the channel is a dielectric layer 132, which in one embodiment is $SiO_2$. In one example, dielectric layer 132 is 8 nm thick. Because programming and erasing is performed by moving electrons through dielectric layer 132 (e.g., on and off the floating gate), dielectric layer 132 is often referred to as the tunnel dielectric or tunnel oxide. Above dielectric layer 132 is the floating gate 134, which in one embodiment is polysilicon. In one example, floating gate 134 is 85 nm. Above floating gate 134 is inter-gate dielectric layer 136, which in one embodiment is $SiO.sub.2$. In one example, inter-gate dielectric layer 136 is 14 nm thick. Above inter-gate dielectric layer 136 is control gate 138, which in one embodiment is polysilicon and/or a metal (can be the same metal as the word line).

FIG. 4 is a cross section of another embodiment of a memory cell 140 on a NAND string (e.g., such as any of the memory cells depicted in FIGS. 1 and 2). In one example implementation, the memory cell of FIG. 3 a Low Endurance Long Retention memory cell that will store multi-state data and the memory cell of FIG. 4 is a High Endurance Short Retention memory that will store binary data. In various embodiments, the memory cells of FIG. 3 and FIG. 4 can be implemented in the same memory array or in different arrays in same memory system. In other embodiments, a memory system may only have memory cells according to FIG. 3 or only have memory cells according to FIG. 4.

FIG. 4 depicts the proposed High Endurance Short Retention memory cell that has a smaller floating gate and stores binary data (two states—erased and programmed). As in FIG. 3, the memory cell is implemented in a p-well, within an n-well that is in a p type substrate. N+ diffusion regions, serving as the source and drain, are located in the p-well. The area in the p-well between the N+ diffusion regions is the channel. Above the channel is a dielectric layer 142, which in one embodiment is SiO$_2$. In one example, dielectric layer 142 is 5 nm thick. Above dielectric layer 142 is the floating gate 144, which in one embodiment is polysilicon. In one example, the floating gate 144 is 40 nm thick (height). Above floating gate 144 is inter-gate dielectric layer 146, which in one embodiment is SiO$_2$. In on example, inter-gate dielectric layer 146 is 10 nm thick. Above inter-gate dielectric layer 146 is a control gate 148, which in one embodiment is polysilicon and/or a metal (can be the same metal as the word line). As described above, the High Endurance Short Retention memory cell 140 of FIG. 4 (storing binary data) has a thinner (e.g. shorter) floating gate and thinner tunnel dielectric than the Low Endurance Long Retention memory cell 130 of FIG. 3 (storing multi-state data). Because memory cell 140 has a thinner floating gate and thinner tunnel dielectric, the overall height of memory cell 140 is shorter than the overall height of memory cell 130.

With such structures that have a much thinner tunnel oxide, the program voltage Vpgm can be significantly reduced, resulting in lower voltage required in the area of the circuit, as well as the charge pumps required for such memory chips. Due to the lower voltages needed to program and erase the new memory cell, cell structure with less aspect ratio is acceptable and making manufacturing process significantly easier and cheaper. Further due to the lower programming voltage needed to program such a memory cell, the field between adjacent wordlines is also reduced, resulting in less breakdown and high reliability characteristics.

Figure 5:
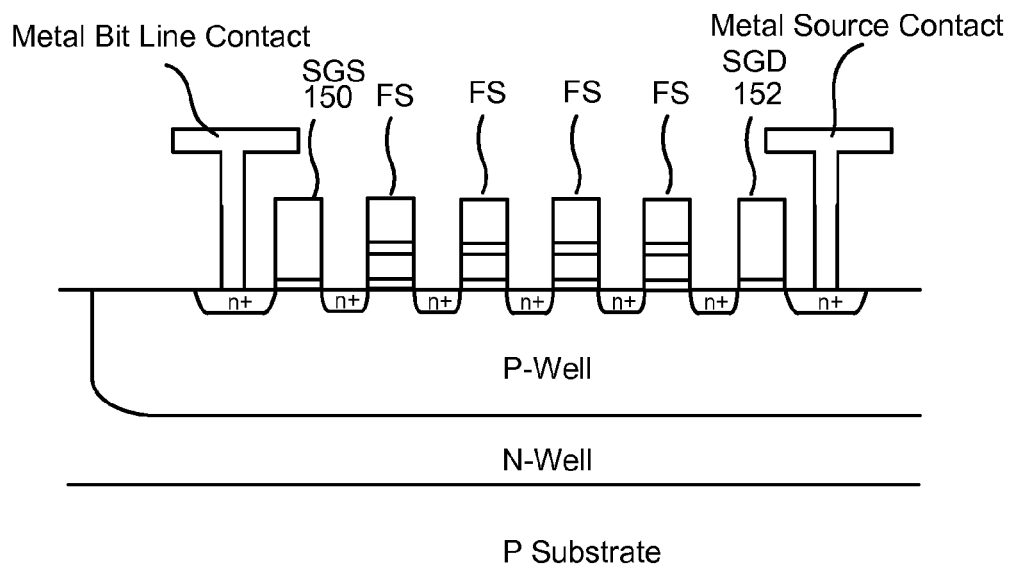
FIG. 5 depicts a cross section of a NAND string.
Figure 6:
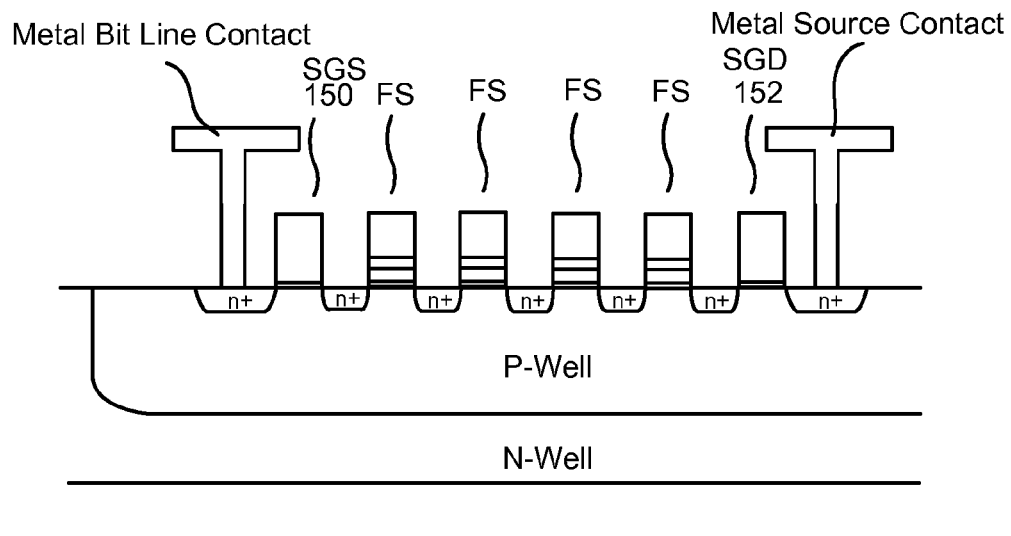
FIG. 6 depicts a cross section of a NAND string.

FIG. 5 is a cross section of a NAND string having memory cells according to the structure of FIG. 3—Low Endurance Long Retention. FIG. 6 is a cross section of a NAND string having memory cells according to the structure of FIG. 4—High Endurance Short Retention. Both FIGS. 4 and 5 show the NAND strings implemented in p-wells, within n-wells, within the p substrate. N+ diffusion regions, serving as the sources and drains, are located in the p-well. FIGS. 5 and 6 show the Bit Line Contacts, Metal Source Line Contacts, the source selection lines (SGS 150) and the drain selection lines (SGD 152). Each of the memory cells include a floating gate stack (FS), that comprises a tunnel dielectric, floating gate, inter-gate dielectric and control gate. As can be seen, the floating gates of FIG. 6 are thinner than the floating gates of FIG. 5. Additionally, the tunnel dielectrics of FIG. 6 are thinner than tunnel dielectrics of FIG. 5.

The embodiments of FIGS. 5 and 6 assume that within a NAND string, all of the memory cells are the Low Endurance Long Retention memory cells of FIG. 3 or all of the memory cells are the High Endurance Short Retention memory cells of FIG. 4. In some implementations, a memory will have both NAND strings of the type depicted in FIG. 5 and NAND strings of the type depicted in FIG. 6. In some embodiments, a given NAND strings may be mixed such that it includes some memory calls that are the Low Endurance Long Retention memory cells of FIG. 3 and some memory cells are the High Endurance Short Retention memory cells of FIG. 4.

Other types of non-volatile storage devices, in addition to NAND flash memory, can also be used to implement a suitable memory system. For example, a TANOS structure (consisting of a stacked layer of TaN—Al$_2$O$_3$—SiN—SiO$_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 7:
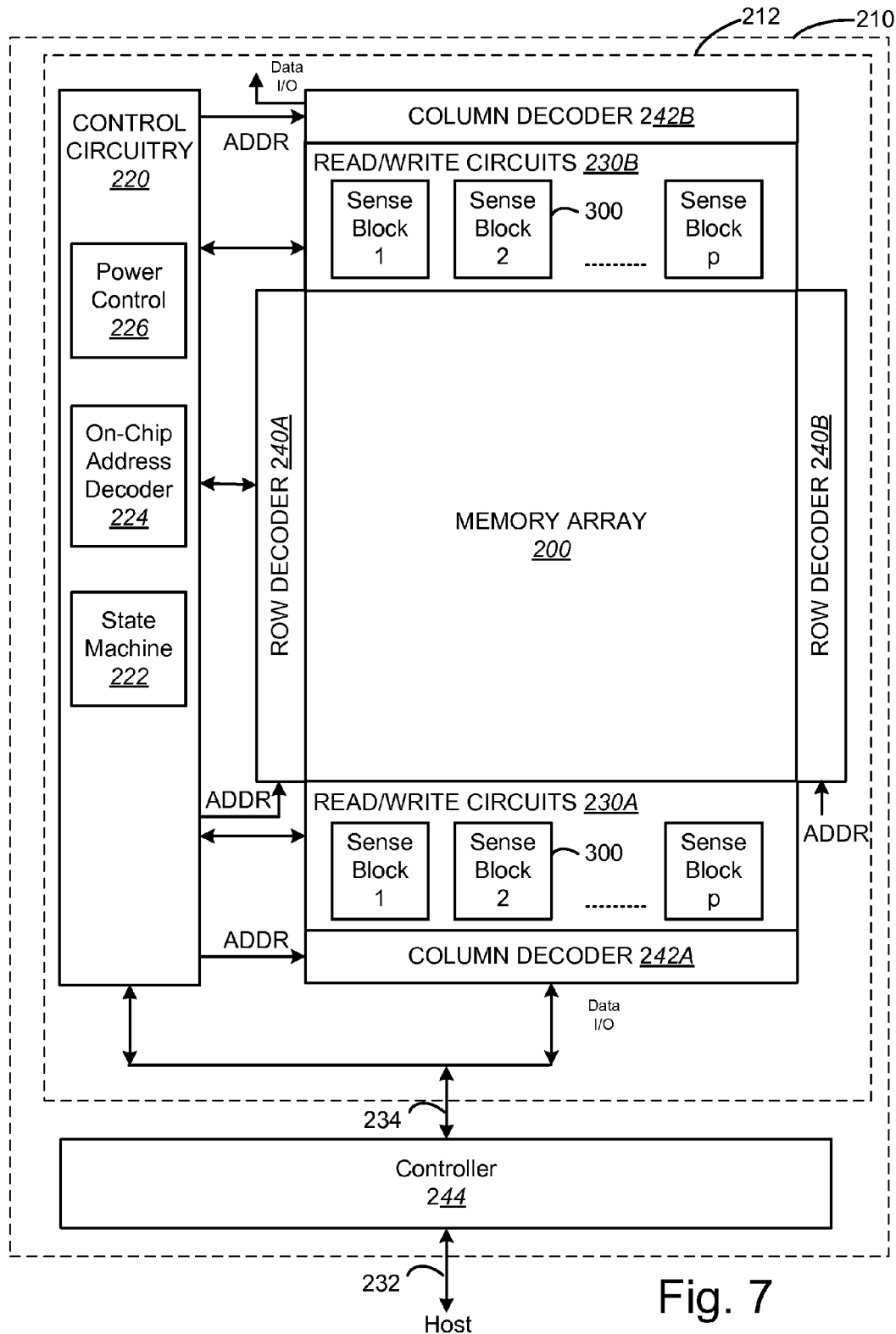
FIG. 7 is a block diagram of a non-volatile memory system.

FIG. 7 is a block diagram of a memory device 210 that can include the memory cells discussed above. Memory device 210 includes read/write circuits for reading and programming a page of memory cells (e.g., NAND multi-state flash memory) in parallel. Memory device 210 may include one or more memory die or chips 212. Memory die/chip 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing or control circuits.

Figure 8:
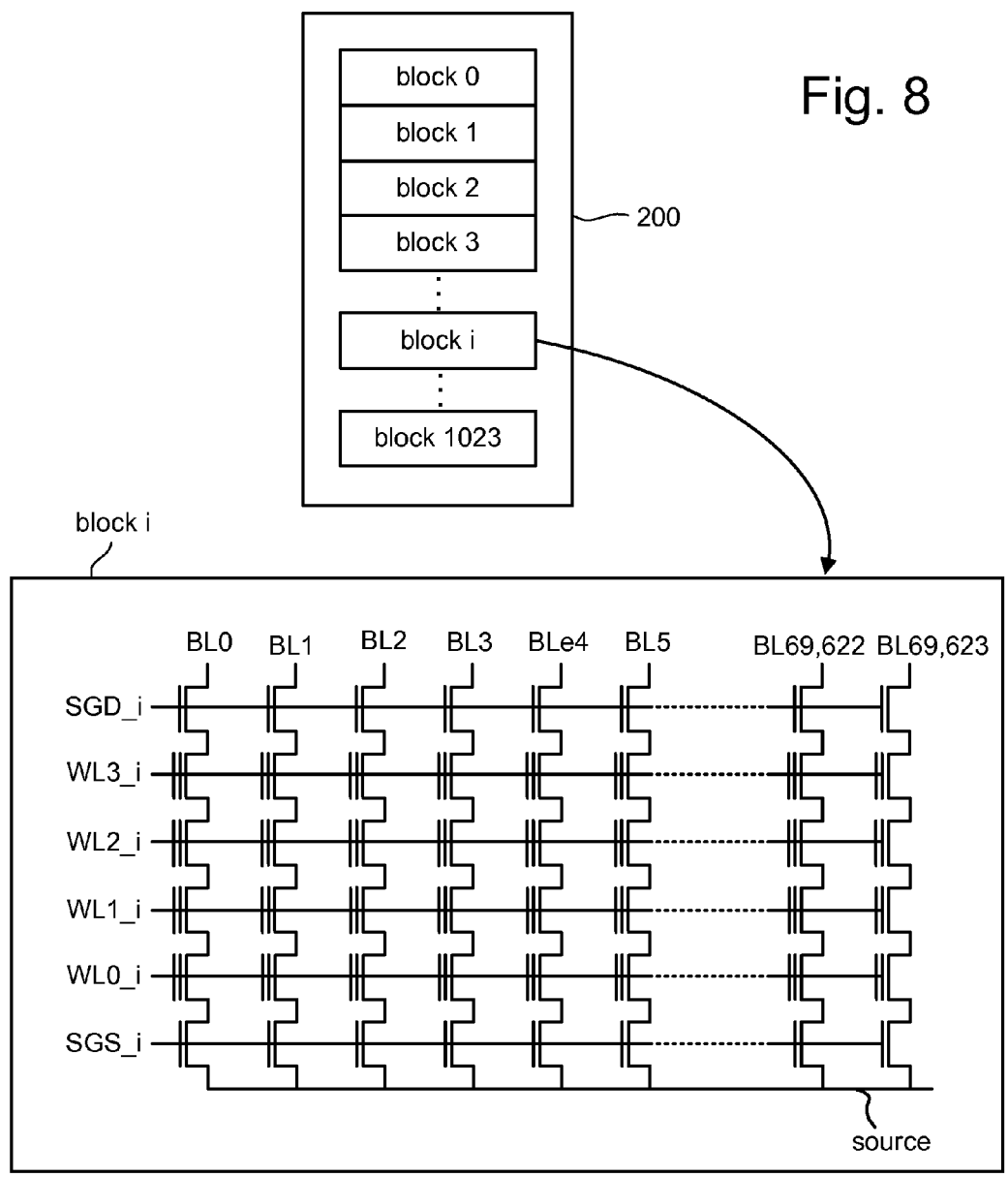
FIG. 8 is a block diagram depicting one embodiment of a memory array.

FIG. 8 depicts an exemplary structure of memory array 200. In one embodiment, the array of memory cells is divided into a large number of blocks of memory cells. As is common for flash EEPROM systems, the block is the unit of erase. That is, each block contains the minimum number of memory cells that are erased together.

As one example, the NAND flash memory array depicted in FIG. 8 is partitioned into 1,024 blocks. However, more or less than 1024 blocks can be used. In each block, in this example, there are 69,624 columns corresponding to bit lines BL0, BL1, . . . , BL69,623. In one embodiment, all the bit lines of a block can be simultaneously selected during read and program operations. Memory cells along a common word line and connected to any bit line can be programmed (or read) at the same time. In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 8 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associate with other numbers of pages.

Figure 9:
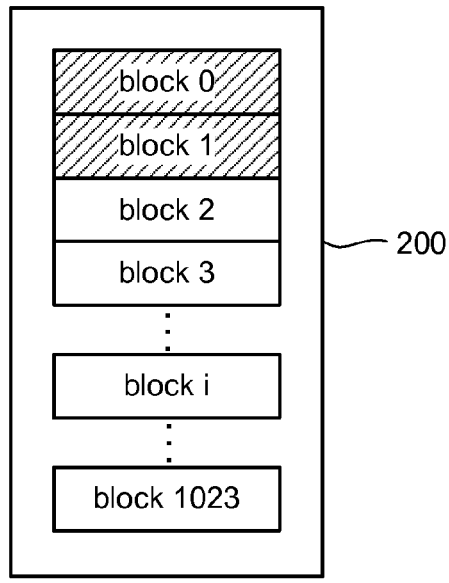
FIG. 9 is a block diagram depicting one embodiment of a memory array.

In one embodiment, each of the blocks depicted in FIG. 8 include memory cells according to the structure of FIG. 3. In other embodiments, a memory array may include some memory cells according to the structure of FIG. 3 and some memory cells according to the structure of FIG. 4. For example, FIG. 9 shows another embodiment of memory array 200 for which block 0 and block 1 include High Endurance Short Retention memory cells storing binary data according to the structure of FIG. 4 (as indicated by the shading) and the remaining blocks include Low Endurance Long Retention memory cells storing multi-state data according to the structure of FIG. 3. In one example, blocks 0 and 1 can serve as a cache for the remaining blocks. In another example, block 0 and 1 can store data that is to be short lived (e.g., calculation, scratch pad, temporary data, applications being run, etc.), while the remaining blocks stored long term data.

Figure 10:
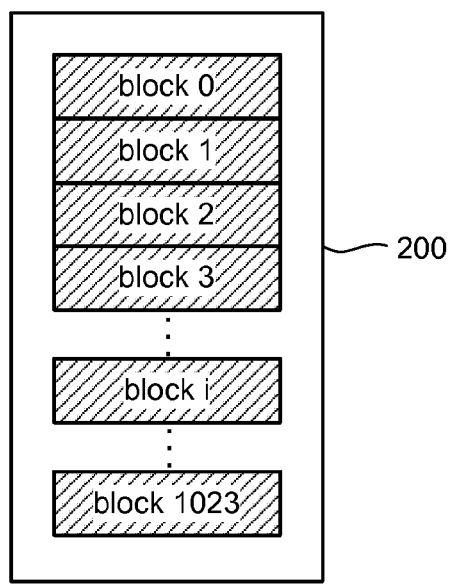
FIG. 10 is a block diagram depicting one embodiment of a memory array.

FIG. 10 shows another embodiment of memory array 200 in which all blocks include High Endurance Short Retention memory cells storing binary data according to the structure of FIG. 4 (as indicated by the shading).

Figure 11:
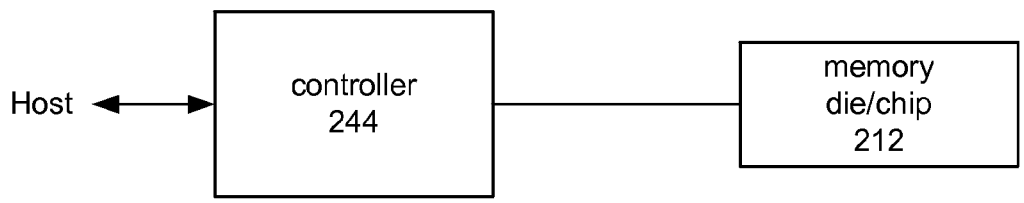
FIG. 11 is a block diagram depicting one example organization of a memory system.

FIGS. 11-14 show various embodiments for using the memory arrays depicted in FIGS. 8-10. For example, FIG. 11 shows controller 244 in communication with a host and memory die/chip 212, where memory die/chip 212 can include a memory array according to any of FIGS. 8-10 or any other memory that includes a combination of High Endurance Short Retention memory cells storing binary data according to the structure of FIG. 4 and Low Endurance Long Retention memory cells storing multi-state data according to the structure of FIG. 3. Thus, memory die/chip 212 of FIG. 11 can include only High Endurance Short Retention memory cells storing binary data according to the structure of FIG. 4, only Low Endurance Long Retention memory cells storing multi-state data according to the structure of FIG. 3, or any combination of both.

Figure 12:
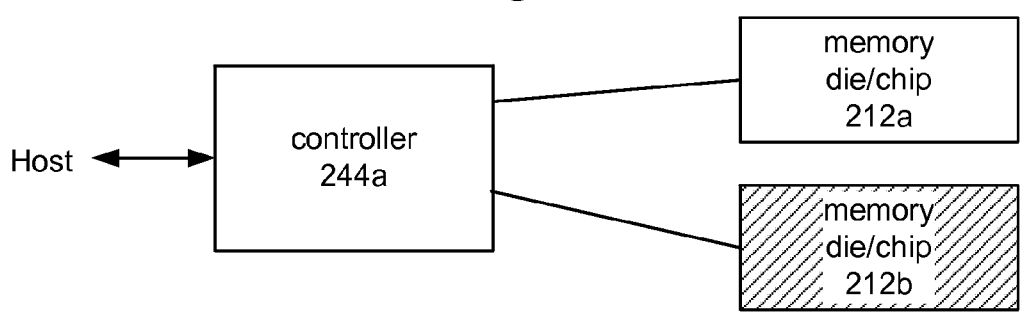
FIG. 12 is a block diagram depicting one example organization of a memory system.

FIG. 12 depicts controller 244 in communication with a host and memory die/chips 212a and 212b, where memory die/chip 212a includes Low Endurance Long Retention memory cells storing multi-state data according to the structure of FIG. 3 and memory die/chip 212b includes High Endurance Short Retention memory cells storing binary data according to the structure of FIG. 4.

Figure 13:
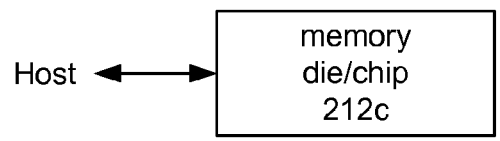
FIG. 13 is a block diagram depicting one example organization of a memory system.
Figure 14:
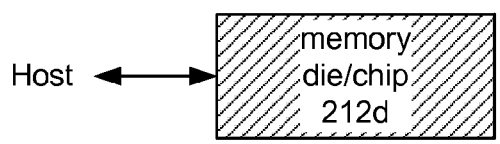
FIG. 14 is a block diagram depicting one example organization of a memory system.

FIG. 13 shows memory die/chip 212c directly in communication with a host (assuming the host includes the logic to operate memory die/chip 212c), where memory die/chip 212c includes only Low Endurance Long Retention memory cells storing multi-state data according to the structure of FIG. 3. FIG. 14 shows memory die/chip 212d directly in communication with a host (assuming the host includes the logic to operate memory die/chip 212d), where memory die/chip 212d includes only High Endurance Short Retention memory cells storing multi-state data according to the structure of FIG. 4.

Figure 15:
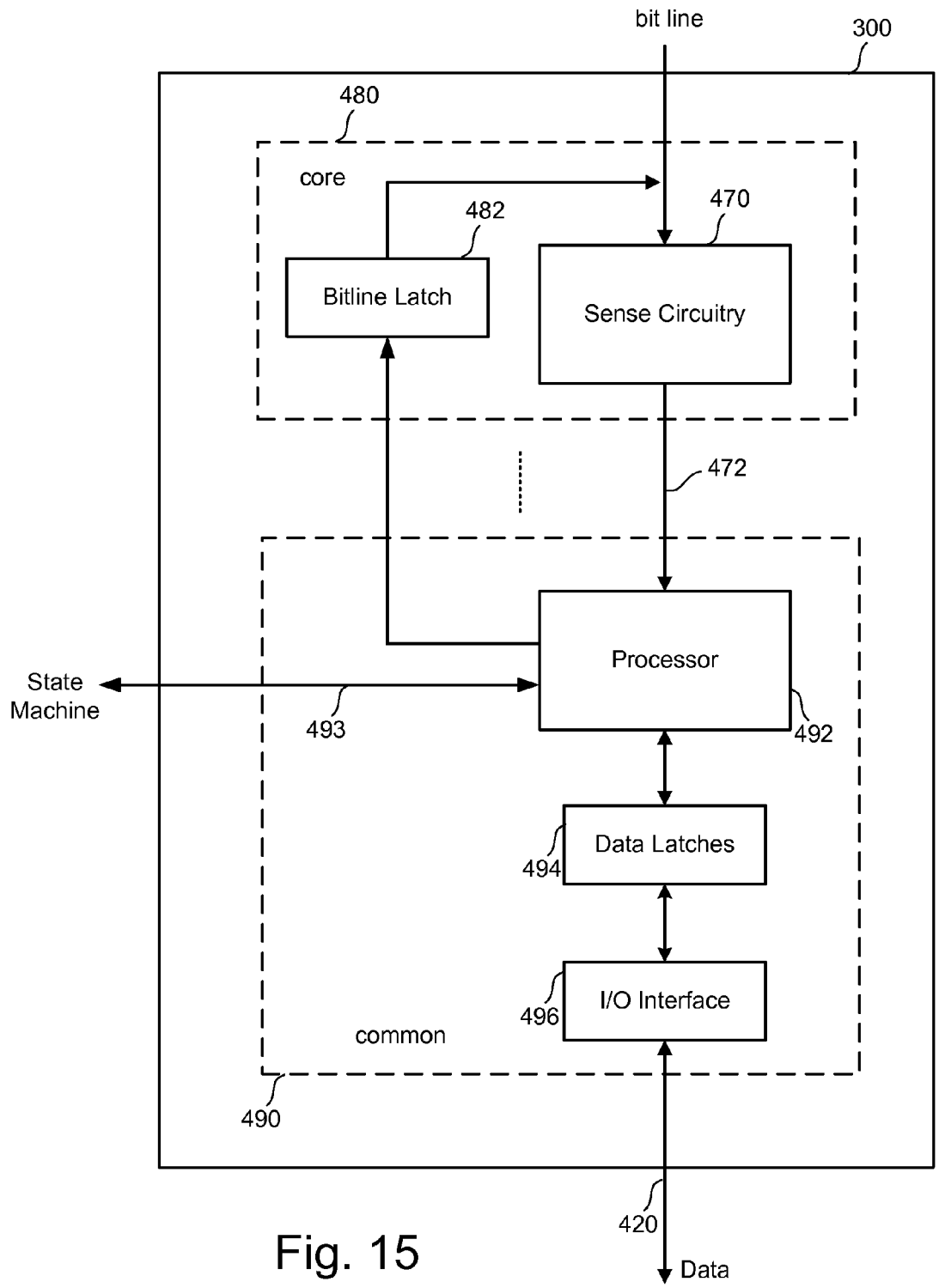
FIG. 15 is a block diagram depicting one embodiment of a sense block.

FIG. 15 is a block diagram of an individual sense block 300 (see FIG. 7) partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 15) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify of the Low Endurance Long Retention memory cells storing multi-state data, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 16:
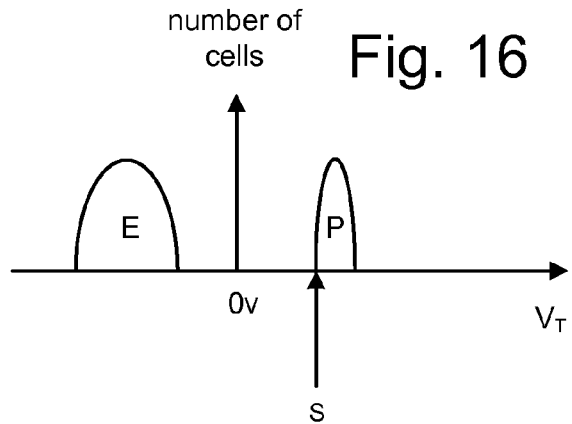
FIG. 16 depicts threshold voltage distributions for binary memory.

At the end of a successful programming process (with verification), the threshold voltages of the memory cells should be within one or more distributions of threshold voltages for programmed memory cells or within a distribution of threshold voltages for erased memory cells, as appropriate. FIG. 16 illustrates example threshold voltage distributions (threshold voltage versus number of memory cells) for memory cells storing one bit of data (a.k.a. binary data). For example, FIG. 16 shows threshold voltage distributions for High Endurance Short Retention memory cells storing binary data according to the structure of FIG. 4. As can be seen, there are two threshold voltage distributions E and P. Threshold voltage distribution E (also known as state E) represents threshold voltages for memory cells that are in an erased state. Threshold voltage distribution P (also known as state P) represents threshold voltages for memory cells that are in a programmed state. In one example, memory cells in the erased state E represent data 1 and memory cells in the programmed state P represent data 0. Memory cells in the erased state E can be programmed into the programmed state P by applying one or more programming pulses that saturate the floating gate of the memory cell with charge (e.g., electrons). Memory cells in the programmed state P can be erased back to the erased state E. In one embodiment, data state E is below 0 volts and data state P is above 0 volts.

Figure 17:
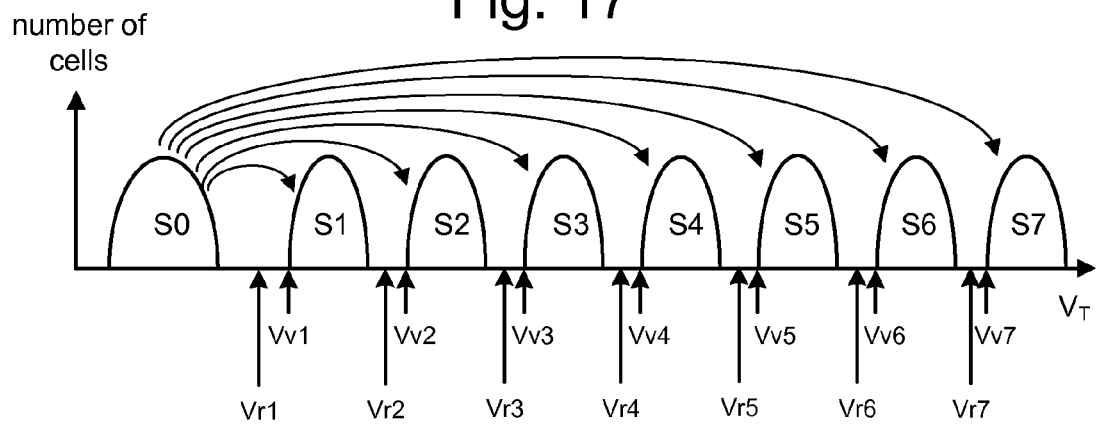
FIG. 17 depicts threshold voltage distributions for multi-state memory, and depicts one example process for programming.

FIG. 17 illustrates example threshold voltage distributions for Low Endurance Long Retention memory cells storing multi-state data according to the structure of FIG. 3, where each memory cell stores three bits of data. Other embodiments, however, may use more or less than three bits of data per memory cell (e.g., such as four or more bits of data per memory cell). Since each memory cell stores three bits of data, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 17.

FIG. 17 shows a set of verify target levels Vv1, Vv2, Vv3, Vv4, Vv5, Vv6, and Vv7. These verify levels are used as comparison levels during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 17 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are storing data for.

In general, during verify operations and read operations, the selected word line is connected to a voltage, a level of which is specified for each read operation (e.g., see read compare levels Vr1, Vr2, Vr3, Vr4, Vr5, Vr6, and Vr7 of FIG. 17 and 0 v of FIG. 16) or verify operation (e.g. see verify target levels Vv1, Vv2, Vv3, Vv4, Vv5, Vv6, and Vv7 of FIG. 7) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

Figure 18A:
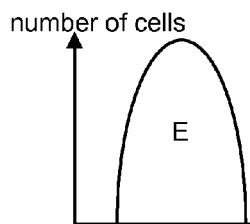
FIGS. 18A-E depict threshold voltage distributions for multi-state memory, and depict one example process for programming.
Figure 18B:
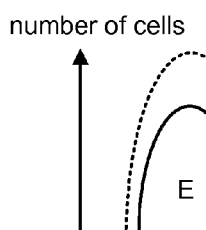

FIG. 17 shows a programming process that includes one phase where all memory cells connected to the same word line are programmed concurrently during that one phase. FIGS. 18A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 18A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 18B. Memory cells being programmed to intermediate state IM are programmed to a target threshold voltage of VvIM.

Figure 18C:
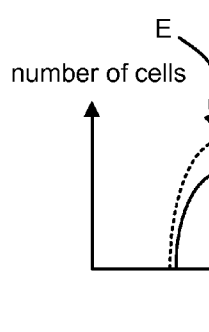
Figure 18D:
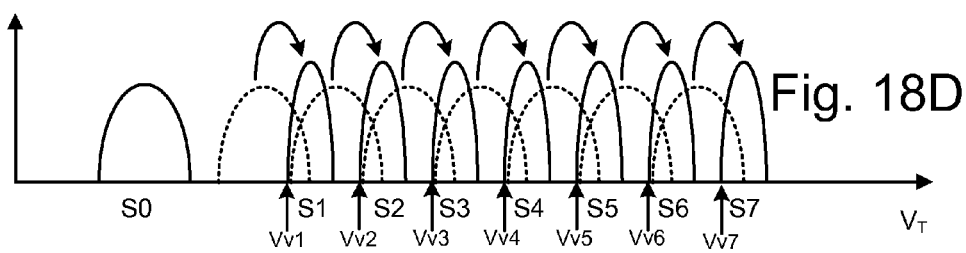

During the second phase of the programming process of FIGS. 18A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state Si are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, those memory cells to be programmed to data state S5 are programmed from intermediate state IM to data state S5, and those memory cells to be programmed to data state S4 are programmed from intermediate state IM to data state S4. This second phase of programming is illustrated in FIG. 18C.

As can be seen in FIG. 18C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

Figure 18E:
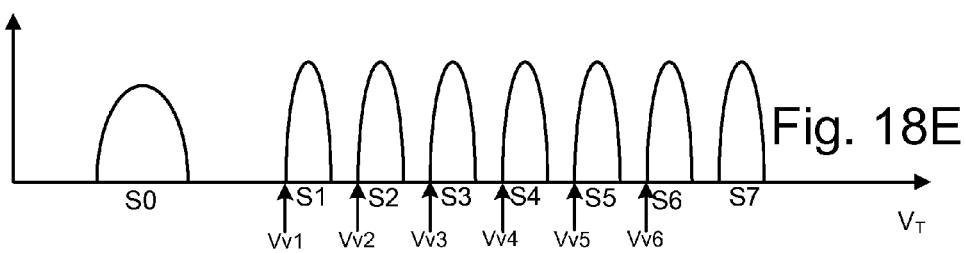

In the third phase of programming, each of data states S1-S7 are tightened so that they no longer overlap with neighboring states. This is depicted graphically by FIG. 18D. The final result of the three phrase programming process is depicted in FIG. 18E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

In some programming processes, coarse/fine programming techniques can be incorporated. For example, memory cells being programmed to a target condition (e.g., Vv2) would first be quickly programmed to coarse condition (e.g., Vv2 less a small voltage) that corresponds to a threshold voltage condition slightly lower than the target condition. Subsequently, the memory cells would be programmed to the target condition in a manner more slowly (and with more precision).

The coarse/fine programming techniques can be used for programming to all or a subset of the data states.

FIG. 19 is a flow chart describing a process for operating Low Endurance Long Retention memory cells storing multi-state data according to the structure of FIG. 3. In step 548, a request to program data is received. In some embodiments, data is programmed without receiving a request. In step 550, all (or a subset) of the memory cells in the block to be programmed are programmed to the highest data state (or another state) to put all of the data cells into the same condition). In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel dielectric layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 or E. One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read (step 558). Many different read processes known in the art can be used to read data. In some embodiments, the read process includes using ECC to correct errors. The data that is read is output to the hosts that requested the read operation. The ECC process can be performed by the state machine, the controller or another device.

FIG. 19 shows that the erase-program cycle (loop consisting of steps 550-556) can happen many times without or independent of reading, the read process can occur many times without or independent of programming, and the read process can happen any time after programming. The process of FIG. 19 can be performed at the direction of the state machine using the various circuits described above. In other embodiments, the process of FIG. 19 can be performed at the direction of the Controller using the various circuits described above.

FIG. 20 is a flow chart describing one embodiment of a process for performing programming on Low Endurance Long Retention memory cells storing multi-state data according to the structure of FIG. 3 connected to a common word line. The process of FIG. 20 can be performed one or multiple times during step 556 of FIG. 19. For example, the process of FIG. 20 can be used to program memory cells (e.g., full sequence programming) from state S0 directly to any of states S1-S7. Alternatively, the process of FIG. 20 can be used to perform one or each of the phases of the process of FIG. 18A-E. For example, when performing the process of FIG. 18A, the process of FIG. 20 is used to implement the first phase that includes programming some of the memory cells from state E to state IM. The process of FIG. 20 can then be used again to implement the second phase that includes programming some of the memory cells from state E to states S1-S3 and from state IM to states S4-S7. The process of FIG. 20 can be used again to adjust states S1-S7 in the third phase (see FIG. 18D). The process of FIG. 20 can also be used with other multi-phase programming processes.

Typically, the program voltage applied to the control gate during a program operation is applied as a series of program pulses. In step 570 of FIG. 20, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed are all connected to the same word line (the selected word line). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. In one embodiment, the verification process is performed by applying the appropriate verify compare voltage (Vv1, Vv2, Vv3, Vv4, Vv5, Vv6, and Vv7) to the selected word line and the current read pass voltage to unselected word lines.

In step 576, it is determined whether all the memory cells have reached their target threshold voltages. If so, the programming process is complete and successful because all selected memory cells were programmed and verified to their target states. A status of "PASS" is reported in step 578. If, in 576, it is determined that not all of the memory cells have reached their target threshold voltages, then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense blocks 300 will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed. In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If number of failed cells is not less than the predetermined limit, than the programming process continues at step 584 and the program counter PC is checked against the program limit value (PL). One example of a program limit value is 20; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

In some embodiments, the program voltage applied to the control gate includes a series of pulses that are increased in magnitude with each successive pulse by a predetermined step size (e.g. 0.2v, 0.3v, 0.4v, or others). Between pulses, some memory systems will verify whether the individual memory cells have reached their respective target threshold voltage ranges. For example, FIG. 21 shows program voltage applied to the control gate as a series of pulses.

Figure 21:
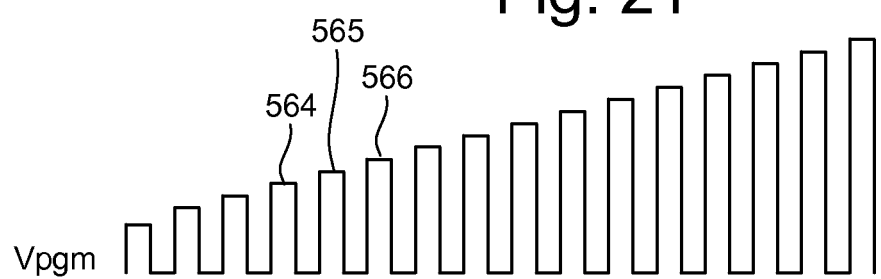
FIG. 21 depicts one example of a programming signal that comprises programming pulses.
Figure 22:
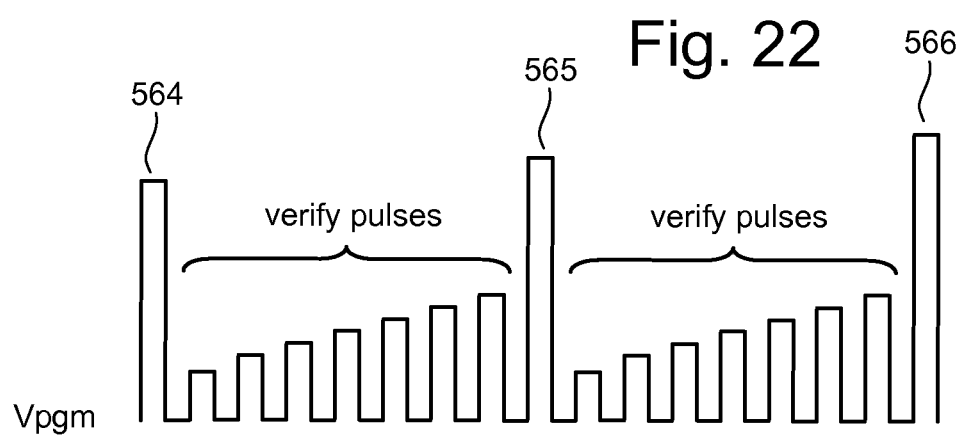
FIG. 22 depicts three programming pulses, and the verify pulses applied between the programming pulses.

FIG. 22 shows a portion of the signal depicted in FIG. 21. More specifically, FIG. 22 shows programming pulses 564, 565 and 566, with a set of verify pulses between the programming pulses. The verify pulses are not depicted in FIG. 21.

When performing full sequence programming in one embodiment, the verification process between programming pulses will test for each of the threshold voltage distribution (data states) S1-S7. Therefore, FIG. 22 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed have reached Vv2, there is no reason to verify at Vv7. More information about intelligent verification schemes that skip verification for one or more states can be found in the following patent documents which are incorporated herein by reference in their entirety: U.S. Pat. Nos. 7,073,103; 7,224,614; 7,310,255; 7,301,817; U.S. Patent App. 2004/0109362; and U.S. Patent App. 2009/0147573.

Figure 23:
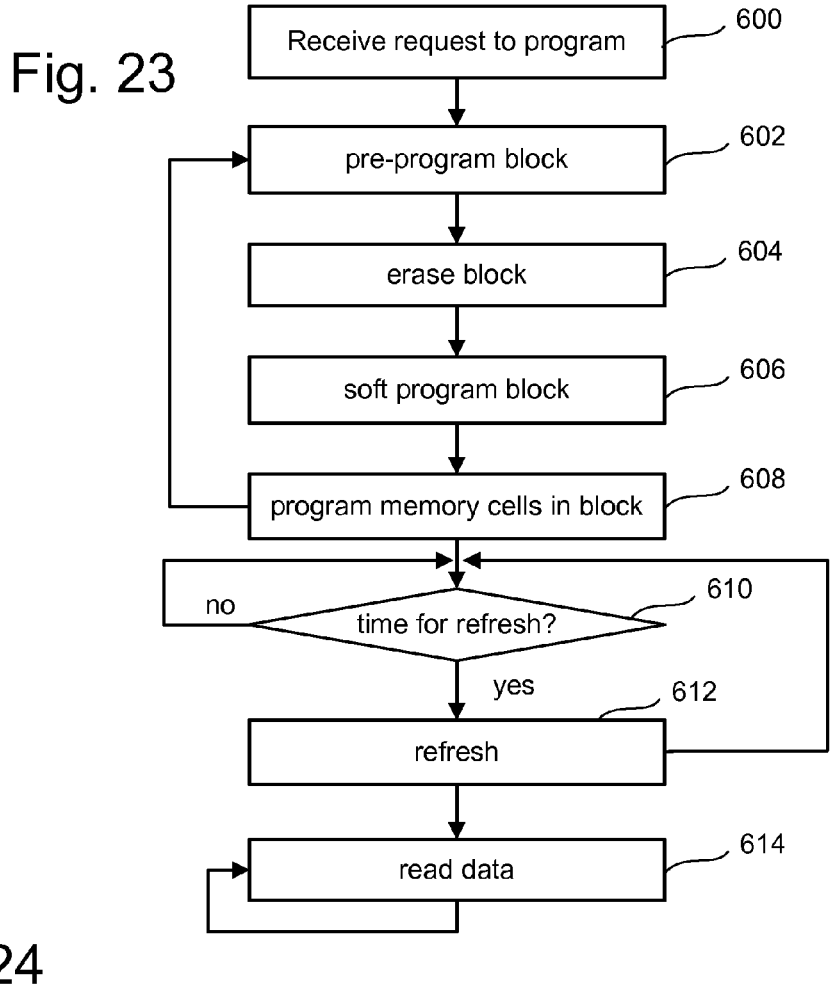
FIG. 23 is a flow chart describing one embodiment of a process for operating non-volatile memory.

FIG. 23 is a flow chart describing a process for operating High Endurance Short Retention memory cells storing binary data according to the structure of FIG. 4. In step 600, a request to program data is received. In some embodiments, data is programmed without receiving a request. In step 602, all (or a subset) of the memory cells in the selected block are programmed to the programmed data state (or another condition) to put all of the data cells into the same condition. In step 604, memory cells are erased (in blocks or other units) prior to programming. In step 606, soft programming is (optionally) performed to narrow the distribution of erased threshold voltages for the erased memory cells. In step 608, the memory cells of the block are programmed. The programming can be performed in response to a request to program from the host, or in response to an internal process.

Since these memory cells have shorter data retention (e.g., days, weeks, months, etc.) they will need to be refreshed from time to time. Step 610 includes determining whether the memory cells need to be refreshed. In one embodiment, the memory system will physically test whether the memory cells need to be refreshed, while in other embodiments the memory system will automatically refresh after a predefined period has elapsed. Examples of physical tests include testing whether the threshold voltage has drifted by a particular amount, testing the behavior of sample or actual memory cells, determining whether the read process has identified more errors, etc. The test for refresh (step 610) can be performed periodically, continuously or in response to a trigger (where the trigger can be based on a condition occurring). If it is determined that a refresh is needed, then a refresh operation is performed in step 612. One example of a refresh operation is to copy the block of data to a new block of memory cells and then mark the old block of memory cells as no longer storing valid data.

Any time after programming, the memory cells of the block can be read (step 614). Many different read processes known in the art can be used to read data. In some embodiments, the read process includes using ECC to correct errors. The data that is read is output to the hosts that requested the read operation. The ECC process can be performed by the state machine, the controller or another device.

FIG. 23 shows that the erase-program cycle (loop consisting of steps 602-608) can happen many times without or independent of reading, the read process can occur many times without or independent of programming, and the read process can happen any time after programming. The process of FIG. 23 can be performed at the direction of the state machine using the various circuits described above. In other embodiments, the process of FIG. 23 can be performed at the direction of the Controller using the various circuits described above. The read process can also be performed in response to both the Controller and state machine.

Figure 24:
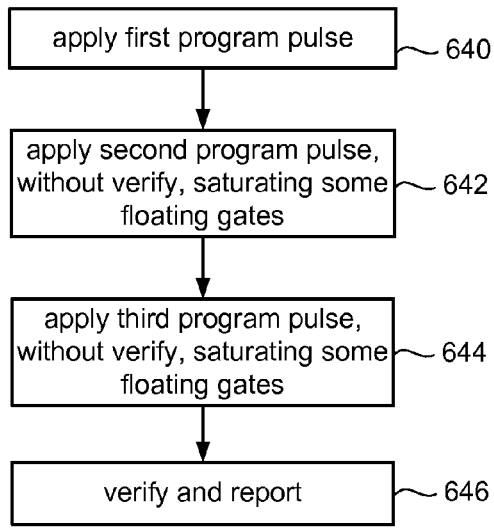
FIG. 24 is a flow chart describing one embodiment of a process for programming non-volatile memory.

FIG. 24 is a flow chart describing one embodiment of a process for performing programming on High Endurance Short Retention memory cells storing binary data according to the structure of FIG. 4 connected to a common word line. The process of FIG. 24 can be performed one or multiple times during step 608 of FIG. 23. For example, the process of FIG. 24 can be used to program memory cells from state E to state P (see FIG. 16).

Typically, the program voltage applied to the control gates (via the common connected word line) during a program operation is applied as a series of program pulses. The embodiment of FIG. 24 includes applying one or more program pulses without performing intervening verify operations. The intent is to saturate the floating gates with electrons so that all (or nearly all) of the programmed memory cells will have a threshold voltage near saturation level so the threshold voltage distribution will be narrow. Since the floating gates will be limited in the charge retention by saturation, there will not be a need to verify between program pulses.

Testing or simulation can be used to determine in advance the exact number of program pulses, the magnitude of the pulses, and the width of the pulses to use to cause all (or nearly all) of the floating gates to reach saturation.

In step 640 of FIG. 24, the first program pulse is applied to the control gates of the selected memory cells (via the common connected word line). In one embodiment, a pulse magnitude between 12-18 volts is used. Some of the memory cells will have their floating gate saturated with electrons due to the first pulse. In step 642, a second program pulse is applied to the control gates of the selected memory cells (via the common connected word line). No verification operation is performed between the first program pulse and the second program pulse. Some of the memory cells will have their floating gate saturated with electrons due to the second pulse. In step 644, a third program pulses is applied to the control gates of the selected memory cells (via the common connected word line). No verification operation is performed between the second program pulse and the third program pulse. Some of the memory cells will have their floating gate saturated with electrons due to the third program pulse. The flow chart of FIG. 24 only shows three program pulses being applied (without verification between the pulses). In other embodiments, more or less than three program pulses can be used.

In step 646, a verification operation can be performed. For example, the system can test whether all programmed memory cells have a threshold voltage greater than S volts (see FIG. 16) and record the number of bits that do not have a threshold voltage greater than S volts. If the number of bits that do not have a threshold voltage greater than S volts is a greater than the amount allowed by the system (the amount that can be corrected by ECC or a little lower than that amount), than the program operation has failed and programming will be repeated by performing the erase-program cycle (loop consisting of steps 602-608) of FIG. 23.

Figure 25:
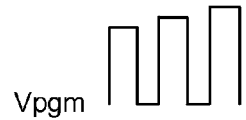
FIG. 25 depicts one example of a programming signal that comprises programming pulses.

As described above, the programming of the High Endurance Short Retention memory cells storing binary data according to the structure of FIG. 4 includes applying one or more program pulses to the control gates of the selected memory cells (via the common connected word line) without performing intervening verify operations. FIG. 25 is an example waveform of the program voltage applied to the common connected word line. The waveform of FIG. 25 depicts the three program pulses of FIG. 24 without the intervening verification pulses depicted in FIG. 22. By skipping the intervening verification operations between program pulses, the programming operation is performed faster.

As discussed above, a memory system may have both the Low Endurance Long Retention memory cells storing multi-state data according to the structure of FIG. 3 and the High Endurance Short Retention memory cells storing binary data according to the structure of FIG. 4. In such a case, then that memory system will need to perform the processes of FIGS. 19 and 20, as well as the processes of FIGS. 23 and 24.

Wider WL or BL Pitch

Figure 26A:
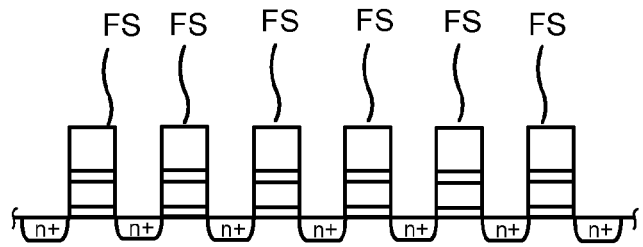
FIG. 26A shows a cross section of a portion of a NAND string.
Figure 26B:
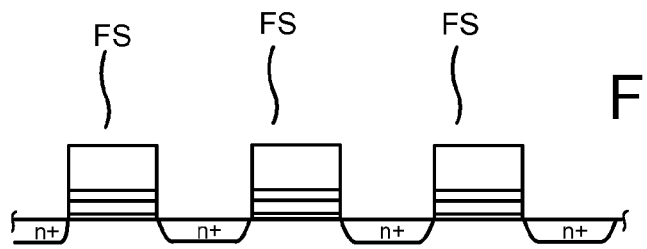
FIG. 26B shows a cross section of a portion of a NAND string.

In one embodiment, the High Endurance Short Retention memory cells storing binary data are implemented with a wider pitch in the word line and/or bit line direction. For example, FIG. 26A shows a cross section of a NAND string, depicting six floating gate stacks FS for Low Endurance Long Retention memory cells storing multi-state data. Each floating gate stack includes a tunnel dielectric, floating gate, inter-gate dielectric and control gate. FIG. 26B shows a cross section of a NAND string that includes High Endurance Short Retention memory cells storing binary data. The NAND string of FIG. 26B includes three floating gate stacks FS. In one embodiment, each of the floating gate stacks of FIG. 26B include the structure of FIG. 4 (discussed above). As can be seen, the width of the floating gate stacks FS is wider in FIG. 26B than in FIG. 26A. In one embodiment, the width of the floating gate stacks FS is 1-2 times wider for the High Endurance Short Retention memory cells storing binary data as compared to the Low Endurance Long Retention memory cells storing multi-state data. Additionally, the width of the channel for the memory cells of FIG. 26B are wider than the width of the channel for the memory cells of FIG. 26A. To get the wider pitch, the word line is also increased in width by the same proportion. In this embodiment, therefore, different blocks in the memory array will have different physical characteristics. For example, one or more blocks will include High Endurance Short Retention memory cells storing binary data having the wider word line and wider floating gate stacks of FIG. 26B, while other blocks of the same memory array (and same chip) will have Low Endurance Long Retention memory cells storing multi-state data with the narrower word lines and narrower floating gate stacks of FIG. 26A.

Figure 26C:
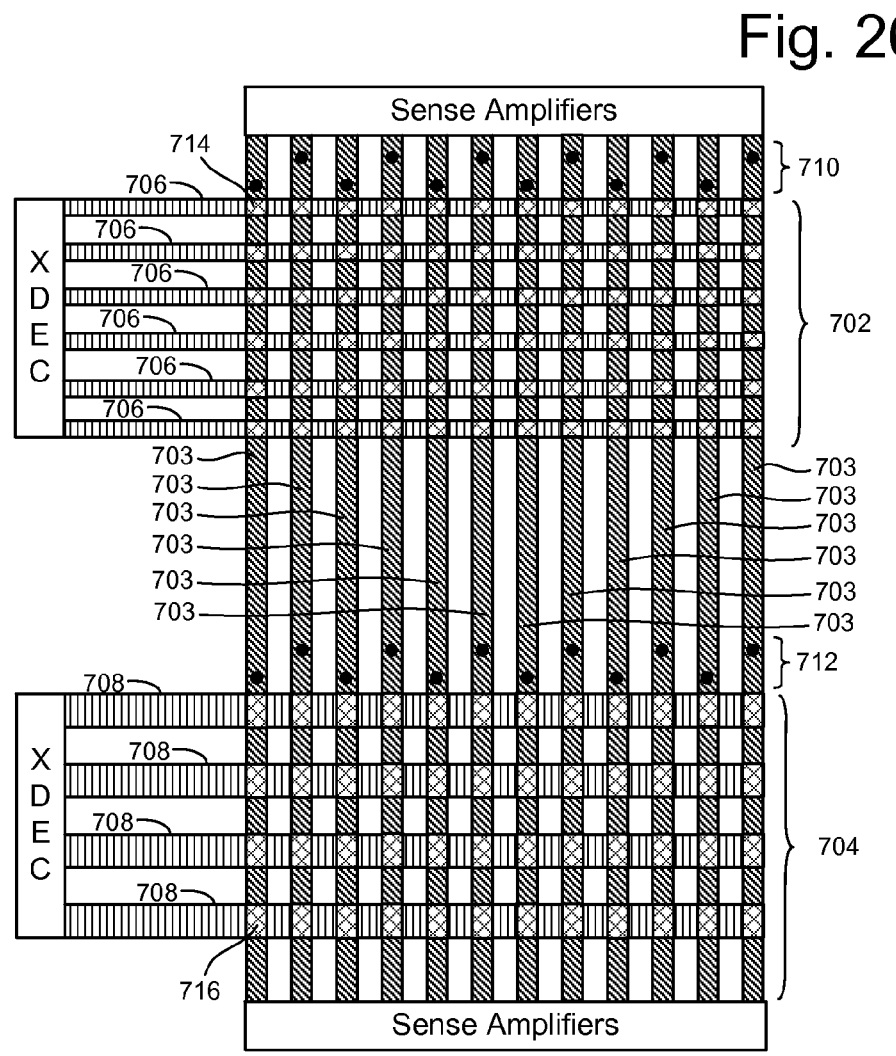
FIG. 26C shows a top view of a portion of two blocks of NAND flash memory on the same chip and in the same array, such that the two blocks have different physical characteristics.

FIG. 26C shows one example of a portion of a memory array including a block 702 and block 704. Both blocks 702 and 704 are part of the same memory array implemented on the same memory chip, on the same substrate. FIG. 26C shows bit lines 703, which in one embodiment go across the entire memory plane (and, therefore, across the entire memory array). At one end of the bit lines 703 is a first set of Sense Amplifiers and at the other end of the bit lines 703 is another set of Sense Amplifiers. Block 702 includes word lines 706 perpendicular to bit lines 702. Block 704 of the block includes word lines 708 perpendicular to bit lines 703. Word lines 706 terminate at word line decoders (XDEC). Word line 708 also terminate at their own set of word line decoders (XDEC). Although block 702 is depicted with six word lines and block 704 is depicted with four word lines, more than six/four word lines will typically be used in a particular block. In one example, a block may have 64 or 128 word lines. Some embodiments may also include dummy word lines at the edges of the blocks. FIG. 26C was illustrated with less than the full amount of word lines to make the drawing easier to read. The NAND strings of block 702 will connect to the various bit lines 703 via bit line contacts 710. The NAND strings of block 704 will connect to the various bit lines 703 via bit line contacts 712. As can be seen from FIG. 26C, the width of word lines 708 are twice as wide as the width of word lines 706.

At the intersection of the word lines and bit lines are the floating gate stacks implementing the memory cells. FIG. 26C shows the floating gate stacks/memory cells as rectangles that are cross hatched (e.g. for example, floating gate stack 714 of block 702 and floating gate stack 716 of block 704). The width of the floating gate stacks of the memory cells of block 704 are twice as wide as the width of floating gate stacks of block 702. Additionally, the width of the channels of the memory cells in block 704 are twice as wide as the widths of the channels of the memory cells of block 702.

The advantage of wider word line (and wider floating gate stacks), is that the short channel effect is reduced, coupling between neighboring floating gates is reduced and the memory cell will experience better endurance.

Figure 27A:
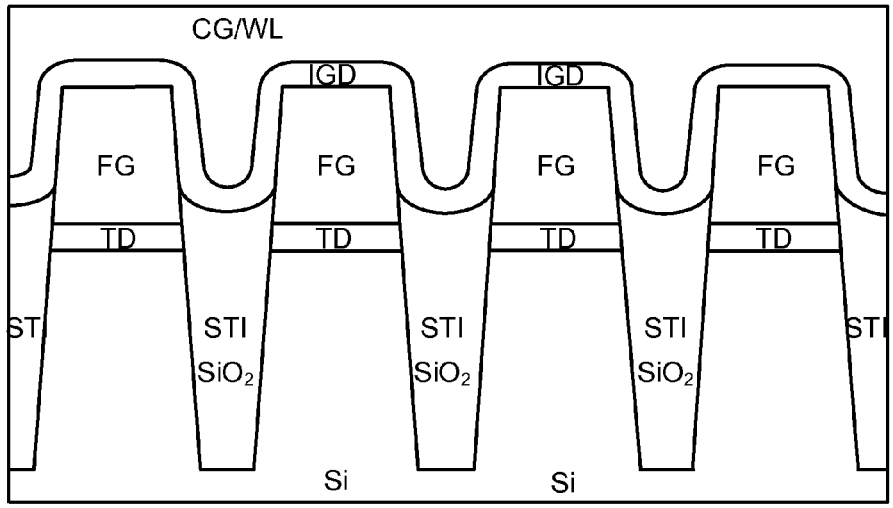
FIG. 27A shows a cross section of a memory array along the word line.
Figure 27B:
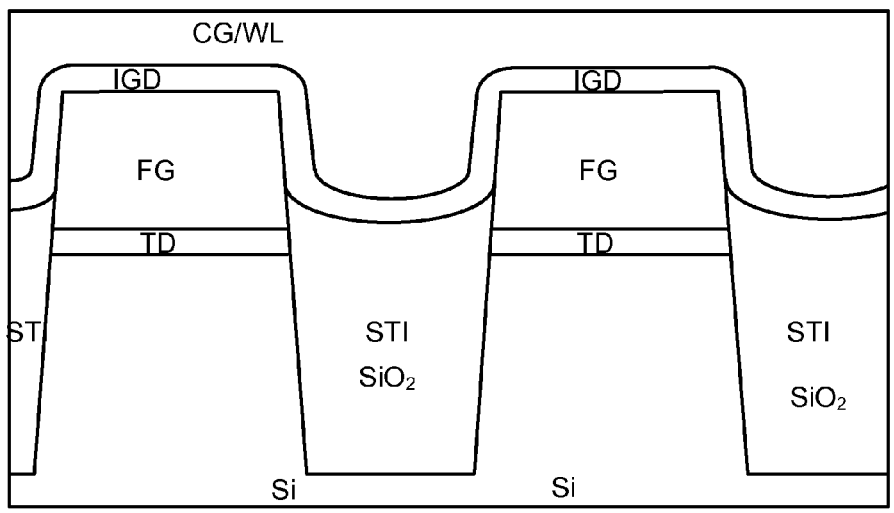
FIG. 27B shows a cross section of a memory array along the word line.
Figure 27C:
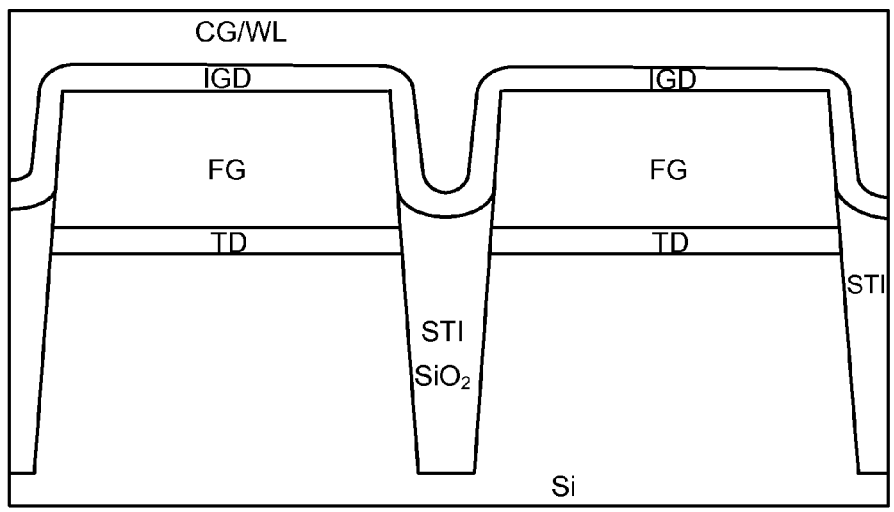
FIG. 27C shows a cross section of a memory array along the word line.

In another embodiment, instead of making the pitch of the memory cell wider in the word line direction, the memory cell can become wider in the bit line direction. FIG. 27A shows Low Endurance Long Retention memory cells for storing multi-state data. FIG. 27B shows a first embodiment of High Endurance Short Retention memory cell storing binary data that have a width in the bit line direction twice as wide as the width of the memory cells of FIG. 27A. Both FIGS. 27A and 27B show a tunnel dielectric (TD) on top of a Silicon substrate. Above the tunnel dielectric (TD) is a floating gate (FG). Above the floating gate (FG) is an inter-gate dielectric (IGD). Above the inter-gate dielectric (IGD) is the control gate, which in one embodiment is part of the word line (CG/WL). FIG. 27C shows an embodiment where the width of the floating gate stacks in the bit line direction are three times the size of the width of the floating gate stacks of FIG. 27A. That is, the High Endurance Short Retention memory cells storing binary data will include a Floating Gate Stack of FIG. 27C that is three times the width in the bit line direction as compared to the floating gate stacks of the Low Endurance Long Retention memory cell string multi-state data as depicted in FIG. 27A. Note that FIGS. 27A-C are cross sections across multiple NAND strings in the word line direction. Thus, each of the floating gate stacks depicted in FIG. 27A are in different NAND strings.

Figure 27D:
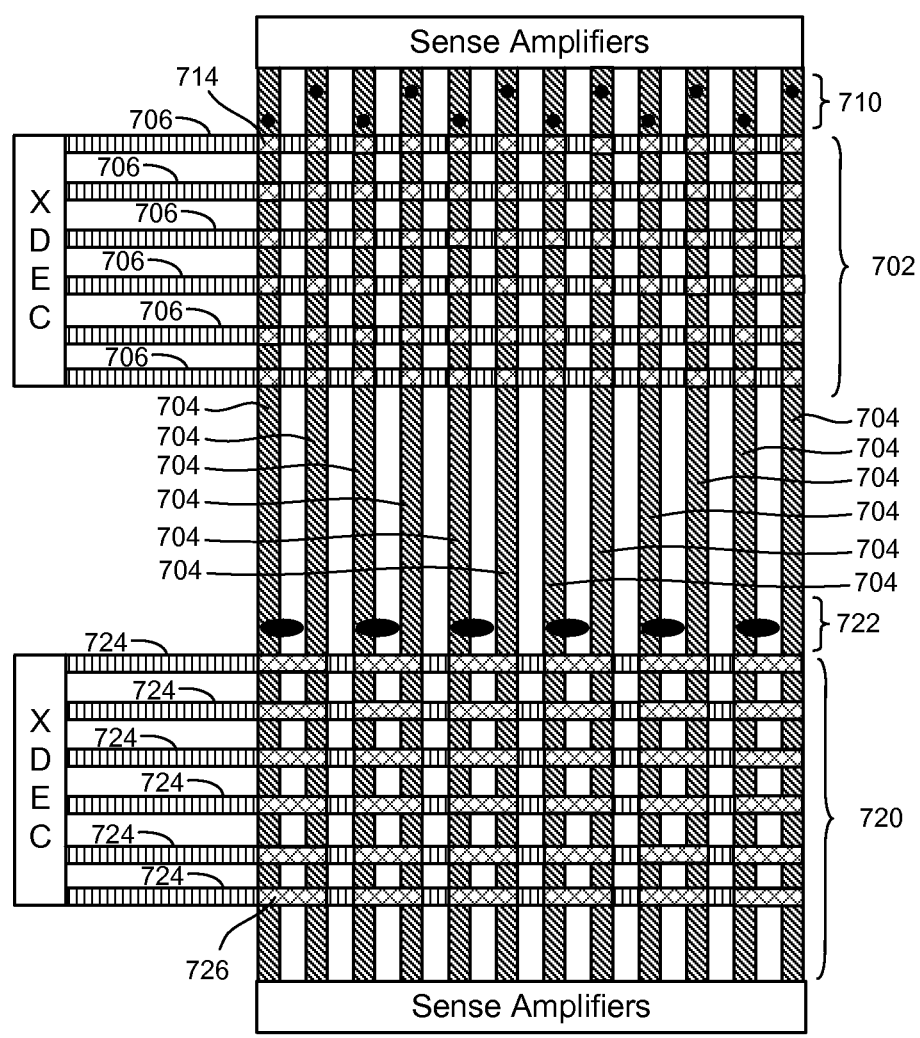
FIG. 27D shows a top view of a portion of two blocks of NAND flash memory on the same chip and in the same array, such that the two blocks have different physical characteristics.

FIG. 27D is a top view of a portion of two blocks of the same memory array (on the same memory chip) implementing different memory cell widths (Floating Gate Stack widths) for High Endurance Short Retention memory cells storing binary data as compared to Low Endurance Long Retention memory cells storing multi-state data. As described above, block 702 of FIG. 27D is the same as block 702 of FIG. 26C, and is used to store Low Endurance Long Retention memory cells storing multi-state data. Block 720 of FIG. 27D includes High Endurance Short Retention memory cells storing binary data for which the width of the memory cells is three times wider in the bit line direction as compared to the Low Endurance Long Retention memory cells of block 702.

Block 720 includes bit line contacts 722 for connecting bit lines 704 to the appropriate NAND strings. Bit line contacts 722 are wider than bit line contacts 710. Additionally, bit line contacts 722 only connect to every other bit line. Thus, only half the bit lines are used by block 720. By skipping half the bit lines, the density of memory cells is cut in half for the block. Therefore, block 720 will have less memory cells than block 702. However, block 720 will have less coupling between floating gates, less short channel effects and better endurance. Block 720 also includes word line 724 connected to word line decoders (XDEC). In the embodiment of FIG. 27D, the width of word lines 724 is the same as the width of word lines 706. So in the embodiment of FIG. 26C, the width of the channels are wider for High Endurance Short Retention memory cells as compared to Low Endurance Long Retention memory cells; however, in the embodiment of FIG. 27D, the width of the channels is the same but the depth of the channels is bigger in the High Endurance Short Retention memory cells (block 720) as compared to the Low Endurance Long Retention memory cells (block 702).

Figure 28:
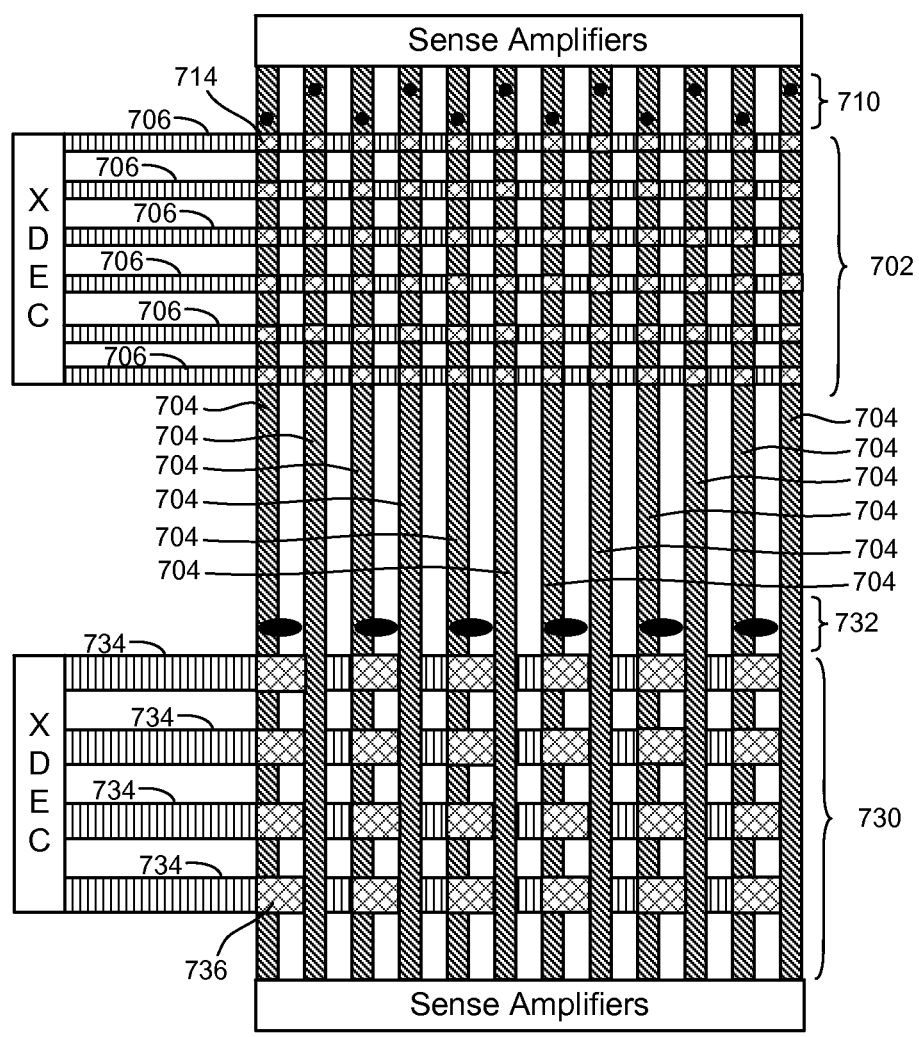
FIG. 28 shows a top view of a portion of two blocks of NAND flash memory on the same chip and in the same array, such that the two blocks have different physical characteristics.

FIG. 28 is a top view of a portion of two blocks of a memory array that implements a wider pitch in both the word line direction and bit line direction for High Endurance Short Retention memory cells as compared to Low Endurance Long Retention memory cells. As discussed above, block 702 implements Low Endurance Long Retention memory cells intended to store multi-state data. Block 730 includes High Endurance Short Retention memory cells intended to store binary data. Block 730 includes bit line contacts 732 which only connect the NAND strings to every other bit line; therefore, there are only half the number of NAND strings in block 730 as compared to block 702. Block 730 includes word lines 734 that are connected to word line decoders (XDEC). In one embodiment, word lines 734 are twice as wide as word lines 706. In other embodiments, word lines 734 can be one-two times wider than word lines 706. As described above with respect to FIG. 27A-C, the memory cells of the High Endurance Short Retention memory cells of FIGS. 27D and 28 can be three times wider or two times wider in the bit line direction. FIG. 27C shows memory cells (e.g. floating gate stacks 714 and 720) being three times wider however, in other embodiments of FIG. 27D the memory cells can be two times wider. For example purposes, the memory cells of FIG. 28 (e.g. Floating Gate Stack 714 and Floating Gate Stack 736) are two times wider in the bit line direction; however, the same memory cells can be implemented to be three times wider. In other embodiments, the High Endurance Short Retention memory cells can be wider than the Low Endurance Long Retention memory cells, in either the bit line direction or word line direction, by any amount (e.g., 1.5, 2.6, 3.3, 4.7 etc.) and are not limited to being wider by integer amounts.

In the embodiment of FIG. 28, each bit line is connected to one Sense Amplifier. Half the bit lines will be connected to Sense Amplifiers on top and half the bit lines will be connected to Sense Amplifier on the bottom. In an all bit line architecture, where all bit lines can be programmed or read at the same time, the memory operations on block 702 will include using the Sense Amplifiers at the top and at the bottom. For memory operations on block 730, only the top Sense Amplifiers will be activated, or only the bottom Sense Amplifiers will be activated. There is no need to activate all the Sense Amplifiers, since only half the Sense Amplifiers need to be used because only half the bit lines are connected. For block 730 For example, block 730 can be connected to only odd bit lines, or only even bit lines. In one embodiment, odd bit lines are connected to top Sense Amplifiers and the even bit lines are connected to the bottom Sense Amplifiers.

Figure 29:
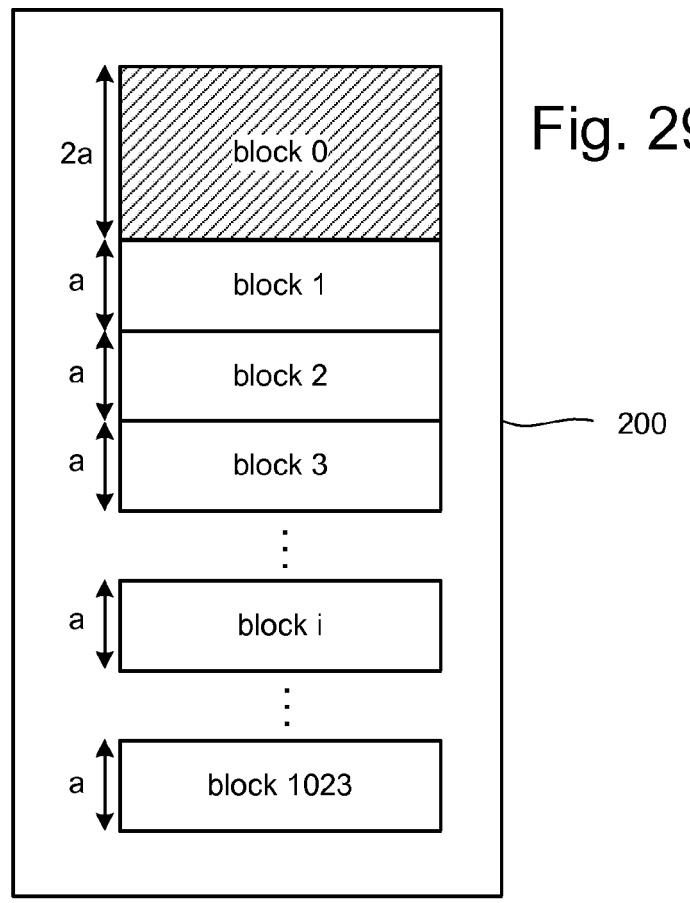
FIG. 29 shows an example organization of a memory array.
Figure 30:
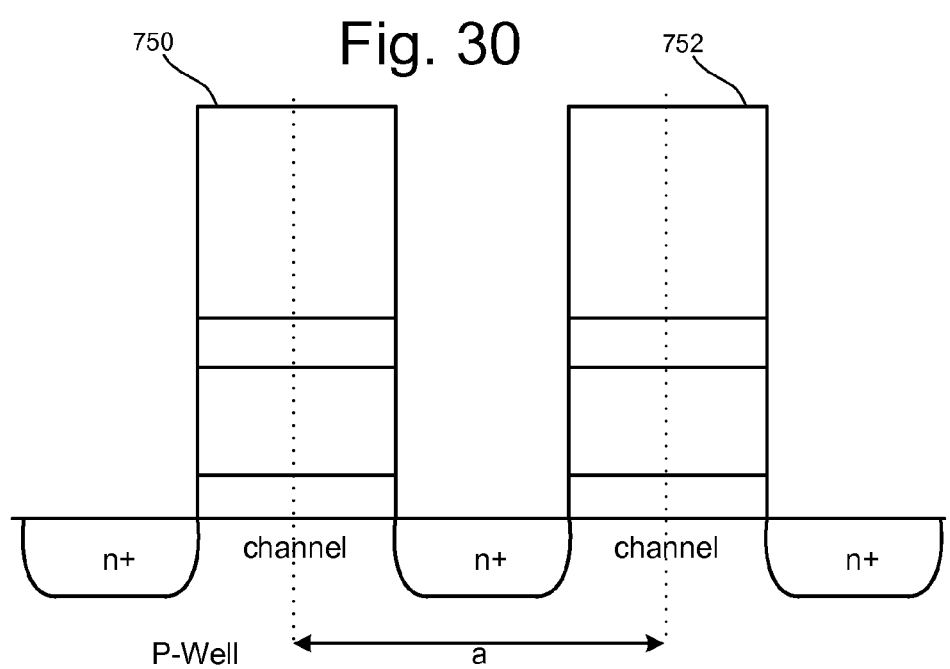
FIG. 30 shows a cross section of a portion of a NAND string.
Figure 31:
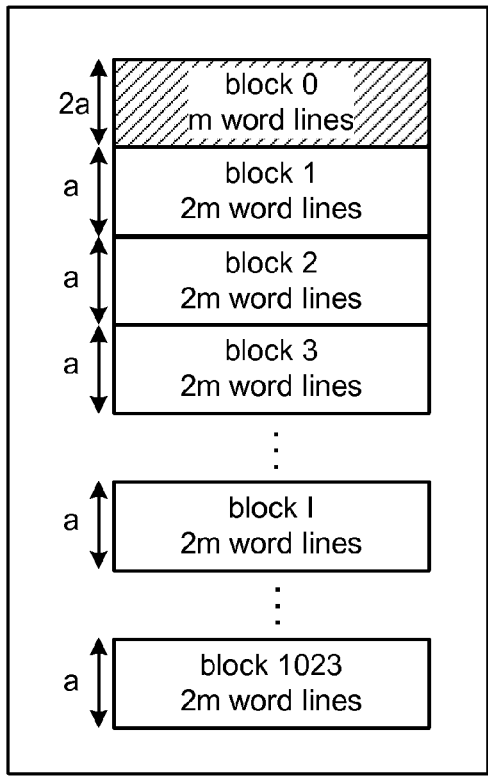
FIG. 31 shows an example organization of a memory array.

FIG. 29 shows an organization of one embodiment of memory array 200. In this embodiment, blocks 1-1023 include Low Endurance Long Retention memory cells for storing multi-state data, while block 0 includes High Endurance Short Retention memory cells to store binary data. FIG. 29 shows block 0 to include memory cells with a pitch of 2a, while blocks 1-1023 include memory cells with a pitch of a (e.g., 24 nm). FIG. 30 shows an example pair of memory cells from block 1, including floating gate stacks 750 and 752. A dotted line down the middle of each of the floating gate stacks is used to indicate the length of pitch a. FIG. 29 is one example implementation according to FIG. 26C where the block with the High Endurance Short Retention memory cells (e.g. block 704 of FIG. 26C and block 0 of FIG. 29) has a wider pitch in the word line direction due to the word lines being wider. If block 0 of FIG. 29 is to have the same number of word lines as blocks 1-1023, then block 0 must be twice as wide as blocks 1-1023. In another embodiment, block 0 can be the same width as blocks 1-1023 if block 0 has half the number of word lines as blocks 1-1023. For example, FIG. 31 shows block 0-1023 all being of the same block size; however, since the memory cells of block 0 have a pitch of 2a, block 0 has half the number of word lines as blocks 1-1023. That is, block 0 includes m word lines while blocks 1-1023 include 2 m word lines.

Figure 32:
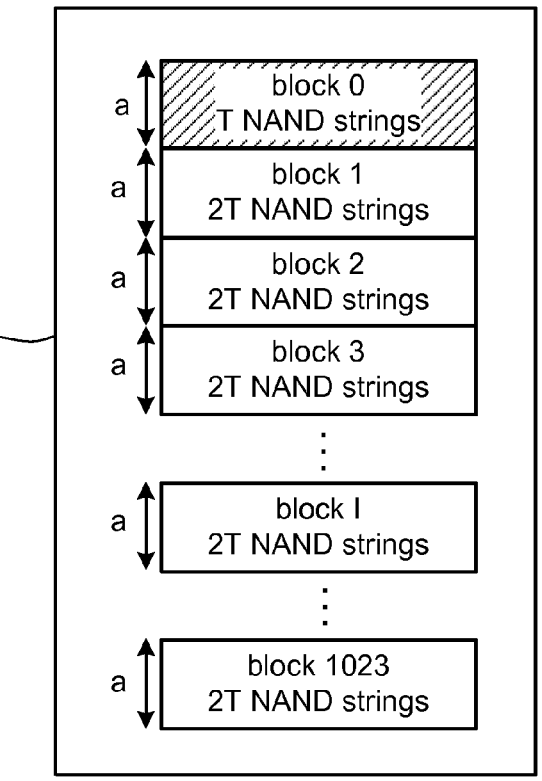
FIG. 32 shows an example organization of a memory array.

FIG. 32 shows an embodiment of memory array 200 where blocks storing High Endurance Short Retention memory cells have memory cells that are wider in the bit line direction. For example, block 0 will store High Endurance Short Retention memory cells, as per FIG. 27D, that are wider in the bit line direction (see block 720). Blocks 1-1023 store Low Endurance Long Retention memory cells (see block 702). In this embodiment, the pitch for all the memory cells is a. However, because block 0 only has NAND strings connecting to every other bit line, block 0 will have less NAND strings than blocks 1-1023. In one embodiment block 0 has T NAND strings and blocks 1-0123 have 2T NAND strings. In other embodiments, the differential in the number of NAND stings can be more or less than two. The embodiments of FIGS. 30-32 depict a memory system where, on the same chip and in the same memory array, blocks will have different physical characteristics. That is, blocks will have different memory cell sizes (also referred to as different channel sizes, different floating gate stack sizes, different control line sizes, etc.).

Phased Sensing

When performing a read operation, bit lines are set up with appropriate voltages for the sensing operation during a bit line pre-charge period. Subsequently, word line voltages are applied to the word lines. Due to the long length of the word lines, it is necessary to allow the word line voltages (e.g. Vr1, Vr2, . . . —see FIG. 17) to propagate along the word lines and settle. Waiting for the word line voltages causes a delay in the read operation. For example, looking back at the block of FIG. 8, one example includes 69,623 bit lines in a block. To accommodate that many bit lines, the word lines are very long. With the long word lines comes a long delay for word line voltages to propagate. One proposal to speed up the read process is to start reading for a first group of memory cells in the block when those memory cells are ready to be read (e.g. the appropriate word line voltages have propagated), without waiting for the rest of the block to be stable.

Figure 33:
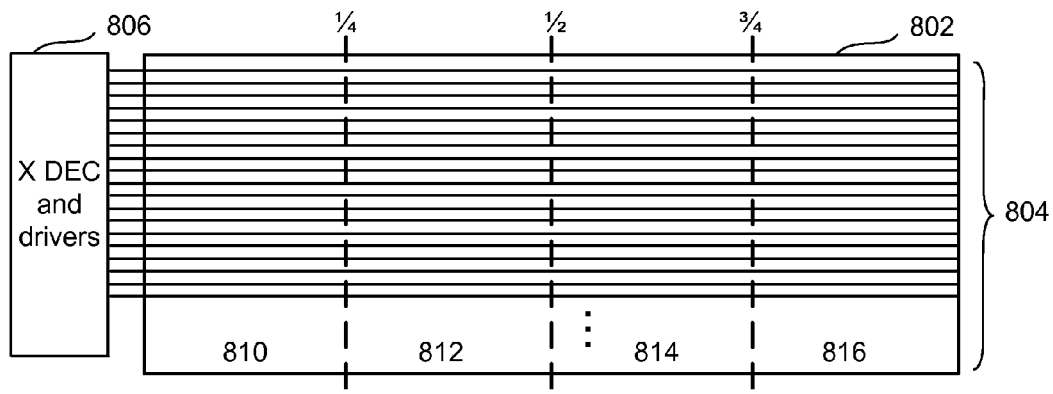
FIG. 33 shows a portion of a memory array with decoders and drivers.

FIG. 33 shows a block of memory cells 802 having a set of word lines 804 that terminate at a word line decoder and driver circuit 806. In one embodiment, there could be word line decoders and drivers on both sides (opposite sides) of the block 802. To reduce the effects of propagation delays on the word lines, the block of memory cells is broken up into groups. The example given in FIG. 33 is to break the block up into four groups representing four quarters. However, other size groups can also be used. The first quarter 810 of the block in FIG. 33 is between the edge of the block and ¼. The second quarter 812 of the block in FIG. 33 is between ¼ and ½. The third quarter 814 of the block in FIG. 33 is between ½ and ¾. The fourth quarter 816 of the block in FIG. 33 is between ¾ and the far edge.

When drivers 806 starts applying the word line signals, that word line signals will settle for the first quarter 810 prior to settling for the last quarter 816. Therefore, the first quarter of the block 810 will be read while the word line signal is still settling for quarters 812, 814 and 816. After the second quarter 812 settles, the memory cells in the second quarter 812 will be read while the word line is still settling for quarters 814 and 816. Once the word line voltages are settled for the third quarter of the block 814, the memory cells of the third quarter 814 will be read while the word line voltages are still settling for the fourth quarter of the block 816. Once the word line voltages are settled for the fourth quarter 816, memory cells in the fourth quarter 816 will be read.

Figure 34:
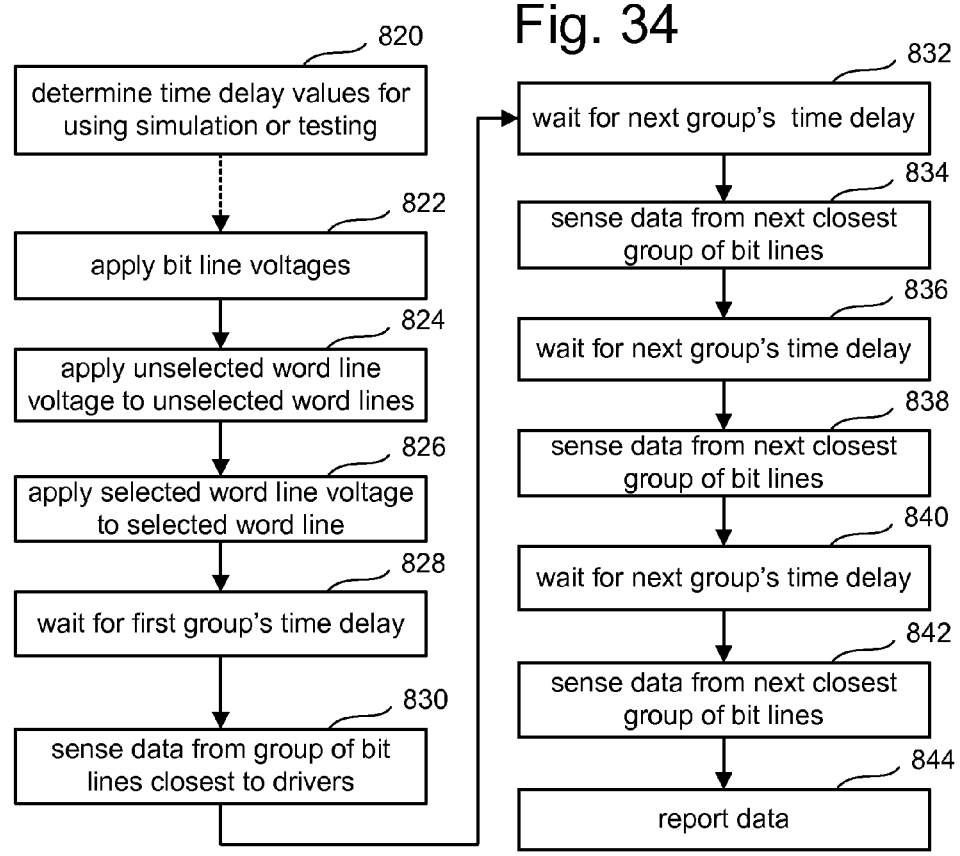
FIG. 34 is a flow chart describing one embodiment of a process for reading non-volatile storage.

FIG. 34 is a flow chart describing one embodiment of the above-described phased sensing. In step 820, time delays are determined for each of the groups of memory cells. In the example of FIG. 33, step 820 includes determining a time delay for the first quarter 810, a time delay for the second quarter 812, a time delay for the third quarter 814, and a time delay for the fourth quarter 816. These time delays can be determined using simulation or testing actual memory chips. A dotted line is shown between steps 820 and 822 because it is contemplated that these steps will not be performed right after each other. In one embodiment, step 820 can be performed during a design phase or a manufacturing phase, while the remainder of FIG. 34 will be performed during user operation of the memory system.

In step 822, the appropriate bit line voltages are applied in order to perform a sensing operation. In step 824, unselected word line voltages are applied to the unselected word lines. For example, a voltage high enough to turn on all of the unselected memory cells will be applied to unselected word lines so that the unselected memory cells in a NAND string will operate as pass gates. In step 826, a selected word line voltage is applied to the selected word line. In one embodiment, when reading binary data (such as in the High Endurance Short Retention memory cells discussed above), the selected word line will receive 0 volts. When reading multi-state data (such as in Low Endurance Long Retention memory cells discussed above), the selected word line can receive any of Vr1, Vr2, . . . . In step 828, the system will wait for the first group's time delay (propagation delay). In the example of FIG. 33, step 828 will include waiting for the delay value for the first quarter 810 of block 802. In step 830, after waiting for the first group's time delay in step 828, data will be sensed from the group of bit lines closest to the drivers. In the example of FIG. 33, step 830 will include reading the memory cells in the first quarter 810 of block 802. Note that FIG. 33 does not show the bit lines. However, there will be bit lines in vertical direction (perpendicular to the word lines 804). The NAND strings will also be in the same direction as the bit lines. One quarter of the NAND strings for block 802 will be in quarter 810 and one memory cell from each of those NAND strings will be read/sensed in step 830. The sensing in step 830 is performed prior to the word line voltage settling for the second quarter 812, third quarter 814 and fourth quarter 816. In other words, while the first quarter 810 has its data sensed, the word line voltage is still settling for the other three quarters (812, 814 and 816).

In step 832, the system will wait for the next group's time delay. In the embodiment of FIG. 33, step 832 includes waiting for the time delay (propagation delay) for the second quarter 812 of block 802. In step 834, data will be sensed for the next group of bit lines. In the example of FIG. 33, this includes sensing data for the bit lines (and NAND strings) in the second quarter 812 of block 802. The sensing for the second quarter 812 is performed while the word line voltage has not yet settled (is still in the process of settling) for the third quarter 814 and fourth quarter 816.

In step 836, the system will wait for the next group's time delay. In the embodiment of FIG. 33, this includes waiting for the time delay for the third quarter 814. In step 838, data will be sensed for the memory cells in the third quarter 814 which is the next closest group of bit lines that has not been sensed yet. The memory cells in step 814 are sensed while the word line voltage is still settling for the fourth quarter 816.

In step 840, the system will wait for the next group's time delay. In the example of FIG. 33, this includes waiting for the delay value for the fourth group 816. In step 842, data will be sensed for the fourth quarter 816. In step 844, all the data sensed will be reported to the controller and/or host. In some embodiments, data is reported to the controller and/or host as soon as it is read (e.g., in steps 830, 834, 838 and 842), rather than waiting for step 844.

If the block is broken up into more than four groups, additional iterations of step 840 and 842 will be performed. Additionally, in one embodiment, data for quarter 812 is not sensed until the sensing is complete for quarter 810, sensing for quarter 814 does not start until sensing for 812 completes, and sensing for quarter 816 does not commence until sensing for quarter 814 completes. In other embodiments, the block can be broken up into other groups (other than quarters), including groups that are not equal in size.

Note that the time delay values determined for step 820 can be relative or absolute. Absolute time delay values would be the delay from applying the word line until it has settled for the first quarter, it has settled for the second quarter, it has settled for the third quarter, and it has settled for the fourth quarter. Relative delay value would be the additional delay after the first quarter has settled that is needed for the second quarter to settle, the additional delay after the second quarter has settled that is needed for the third quarter to settle, and the additional delay needed after the third quarter has settled in order for the fourth quarter to settle. By starting the sensing of groups (e.g. quarters) of the block prior to the word line voltage settling, the read process is preformed faster.

Refresh

In some embodiments, High Endurance Short Retention memory cells will need to be refreshed because they have shorter retention times than Low Endurance Long Retention Memory cells. In one embodiment, High Endurance Short Retention memory cells may need to be refreshed after a period of three months. Other periods for refreshing can also be used including six months, nine months, one year, etc. Additionally, shorter refresh periods that are less than three months such as 1 day or 7 days may also need to be implemented. The refresh operation is performed in order to protect the data from being lost. Many memory systems will use error correction (e.g. ECC); however, there is a limit to what error correction can fix. Some prior systems will periodically refresh by copying a block of data to a new block before the refresh period has ended. One problem with this solution is that a lot of time is wasted copying an entire block when only a portion of the block needs to be refreshed. Furthermore, copying to the new block and erasing the old block is a lengthy process.

One proposed solution herein is, rather than copying an entire block, apply one or more program pulses to the word line for the page that needs to be refreshed. These one or more program pulses can be applied using a self-boosting method to prevent program disturb. In some example implementations, all memory cells that are supposed to be programmed to a common word line will be refreshed, while in other embodiments, only those memory cells that need to be refreshed will be refreshed.

Figure 35:
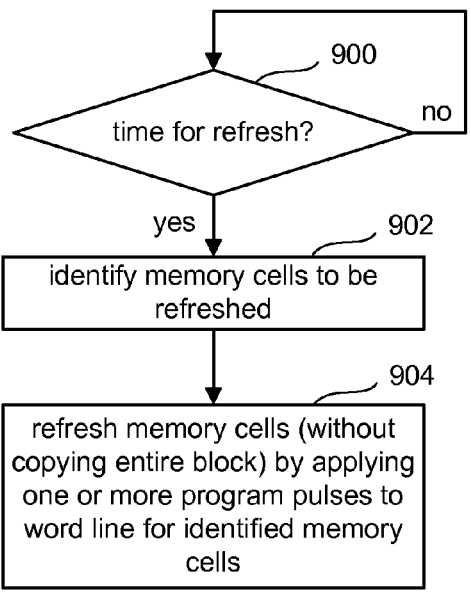
FIG. 35 is a flow chart describing one embodiment of a process for managing refresh for high endurance low retention memory cells.

FIG. 35 is a flow chart describing one example embodiment of a process for managing refresh with High Endurance Short Retention non-volatile memory. The processes of FIG. 35 (as well as FIGS. 36-38) can be performed in conjunction with any of the innovations described above, including the thinner floating gate/tunnel dielectric, saturating the floating gates, phased sensing and/or wider memory cell size. In step 900 of FIG. 35, it is determined whether it is time to refresh the data. There are many techniques for determining whether it is time to refresh. In one embodiment, a refresh is performed after a pre-determined time period. In another embodiment, the data is checked for errors (as described below). In other embodiments, one or more reference memory cells can be tested and used as an indication of the condition of the entire block. If it is not time to refresh, then no refresh will be performed. If it is time to refresh, then in step 902 those memory cells that need to be refreshed are identified. There are many suitable methods for identifying memory cells that need to be refreshed, some of which are described below. However, other techniques can also be used. In step 904, the memory cells that need to be refreshed and were identified in step 902 will be refreshed by applying one or more program pulses to word lines connected to the identified memory cells. Thus, step 904 includes refreshing memory cells without copying the entire block. In one embodiment, only those memory cells that need to be refreshed will be refreshed in response to the one or more program pulses and those memory cells that are programmed but do not need to be refreshed will not be refreshed. In one embodiment, step 904 is performed without performing any verify operation. In another embodiment, step 904 can be performed by applying one or more program pulses (with no intervening verify operation) and then a concluding verify operation. If the concluding verify operation indicates that the memory cells were not properly refreshed (e.g., that threshold voltage is not greater than the verified compare level) than the step 904 is retried. More details of step 904 are provided below.

Figure 36:
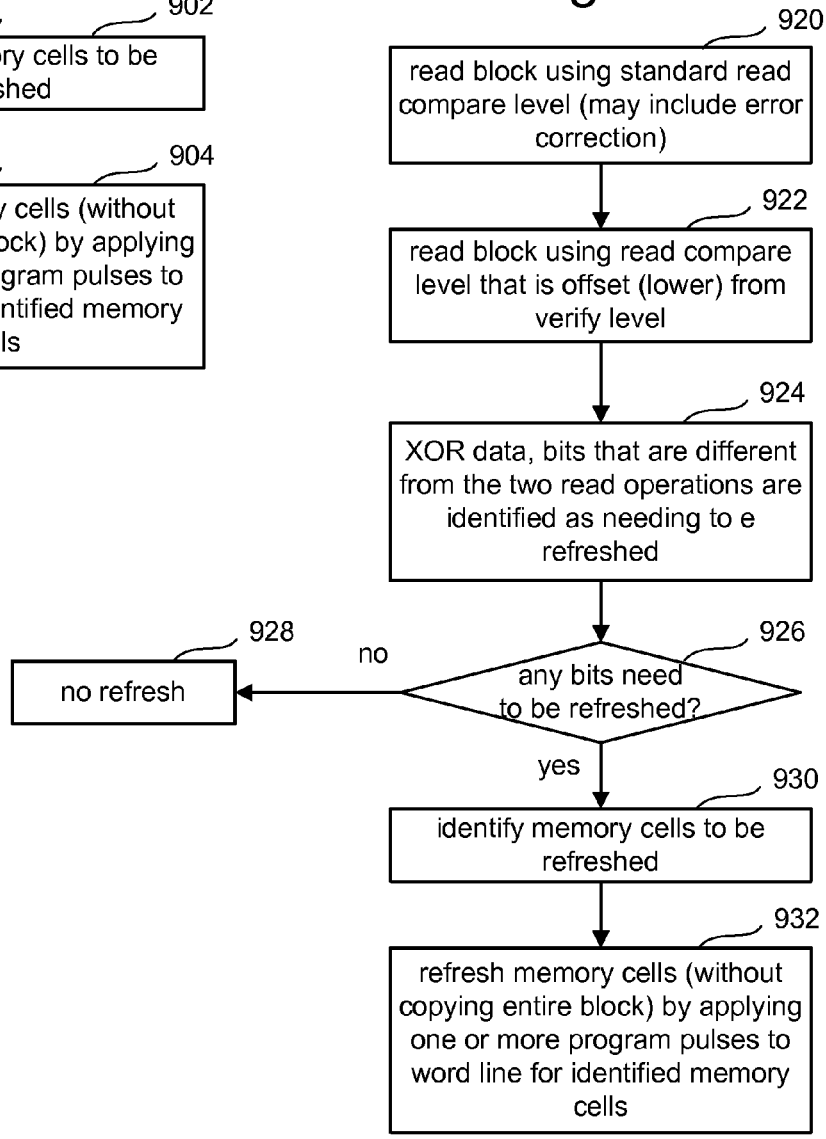
FIG. 36 is a flow chart describing one embodiment of a process for managing refresh operations.

FIG. 36 is a flow chart describing another embodiment for managing refresh operations. In step 920, a block of data is read using the standard read process. In one implementation, the standard read process includes using the standard read compare levels (e.g., Vr1, Vr2, Vr3, . . . ) and error correction. Looking back at FIG. 16, for binary data the read compare level is 0 volts and the verify compare level is S volts. Thus, step 920 can include determining whether each of the memory cells in the block conduct (e.g. turn on) in response to 0 volts. The error correction process will correct those bits that are in error. In some embodiments, the programming process will not program every single bit correctly, and will rely on the error correction process to correct certain bits.

In step 922 of FIG. 36, a read process is performed again on the same block. The read process of step 922 uses a different read compare value than in step 920. For example, instead of applying 0 volts to the word lines (and therefore to the control gates), a read compare value will be applied to the word lines that is offset from the verify level by a small amount. In one example, the verify level S is set at 1 volt and the offset is 0.2 volts; therefore, step 922 will include using a read compare level of 0.8 volts. As the process of step 922 uses an offset lower than the verify level, this process will test which memory cells have drifted by at least the offset amount. Those memory cells that have drifted by the offset amount are candidates for future failure and, therefore, need to be refreshed.

In step 924, the data read from the block in step 920 is XOR'd with the data read in step 922. The XOR process will identify bits that are different in the two read processes. Those bits identified as being different are those that need to be refreshed. If no bits were identified as needing to be refreshed (step 926), then no refresh operation is performed (step 928). If one or more bits were identified in step 924 as needing to be refreshed (step 926), then in step 930 the relevant memory cells that need to be refreshed are identified. In step 932, a refresh operation is performed such that those memory cells identified as needing to be refreshed will be refreshed without other memory cells being refreshed. The refresh process of step 932 includes applying one or more program pulses in the same manner as discussed above with respect to step 904. The process of 936 can be performed periodically on every block of High Endurance Short Retention memory cells. Alternatively, the process of FIG. 36 can be performed in response to a trigger specific to a block, a trigger specific to a portion of a block, or a trigger for the entire memory system.

The refresh process of step 932 is performed without copying the entire block. Additionally, the refresh process of step 932 can be performed without any intervening verify operation or without any verify operation at all. In another embodiment, step 932 can be performed by applying one or more program pulses (with no intervening verify operation) and then a concluding verify operation. If the concluding verify operation indicates that the memory cells were not properly refreshed (e.g., that threshold voltage is not greater than the verified compare level) than the step 932 is retried. More details of step 932 are provided below.

Figure 37:
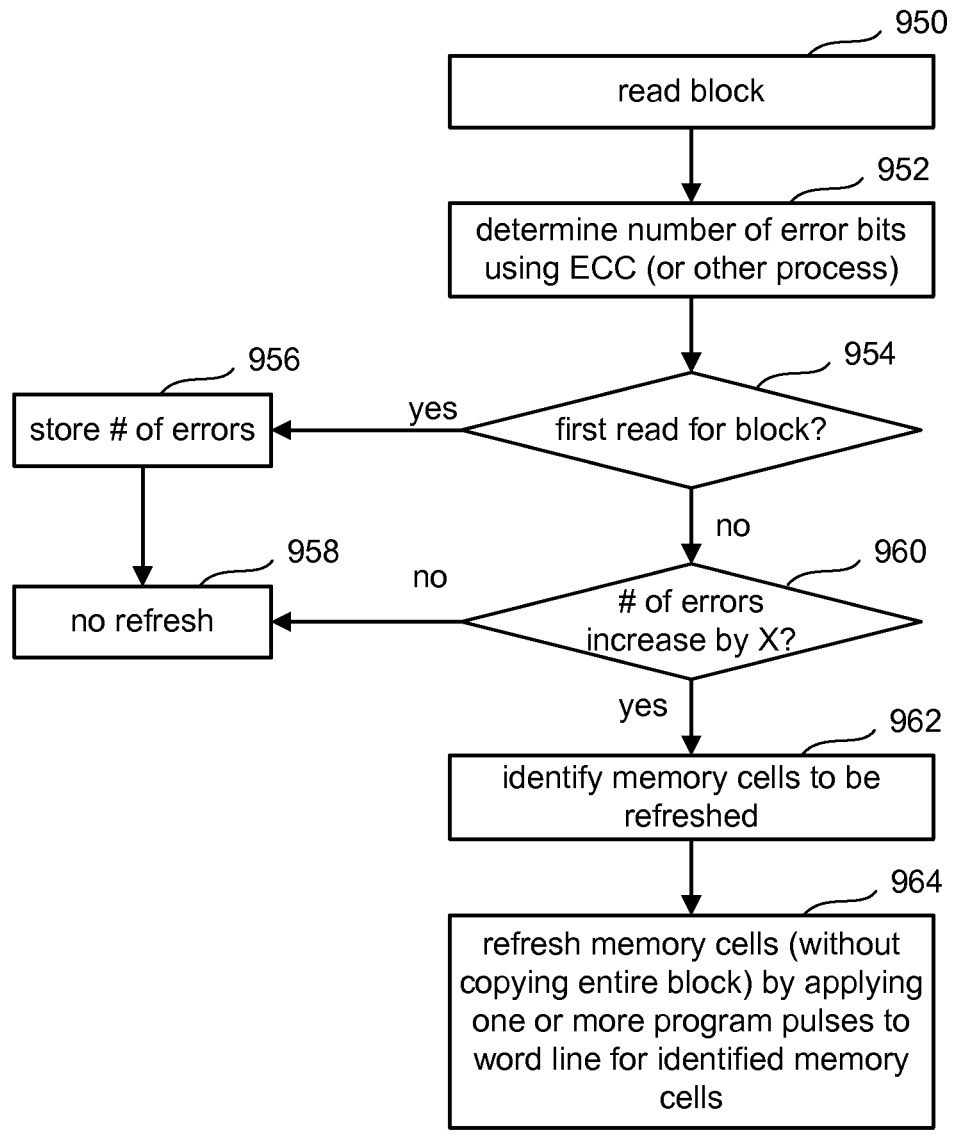
FIG. 37 is a flow chart describing one embodiment of a process for managing refresh operations.

FIG. 37 is a flow chart describing another embodiment for managing the refresh process. In step 950, a block of data is read. In step 952, error correction (e.g. ECC—Error Correction Codes) is used to determine the number of error bits. Other error correction processes can also be used. If this is the first time the block has been read (step 954), then the number of errors determined in step 952 is stored in step 956, and no refresh will be performed (step 958). If this is not the first time the block is read, then in step 960 it is determined whether the number of errors determined in step 962 has increased from the stored number of errors by some amount X (e.g. 2%, 5%, etc.). If the number of errors has not increased by X, then no refresh operation will be performed (step 958). If the number of errors has increased by the amount X (step 960), then the memory cells to be refreshed are identified in step 962. In one embodiment, the system will refresh the memory cells that are identified to be in error. In step 964, a refresh operation is performed in the same fashion as steps 904 and 932. That is, the refresh operation performed without copying the entire block by applying one or more program pulses to the word line to the identified memory cells. In one embodiment, the refresh process of step 964 is performed without intervening verify operations between the program pulses or without any verify operation after the program pulses have completed. In one embodiment, there is no intervening verify operations between program pulses, however after the final program pulse a verify operation will be performed using the verify level of S volts and if the memory cells have not reached S volts then the refresh operation can be repeated.

Figure 38:
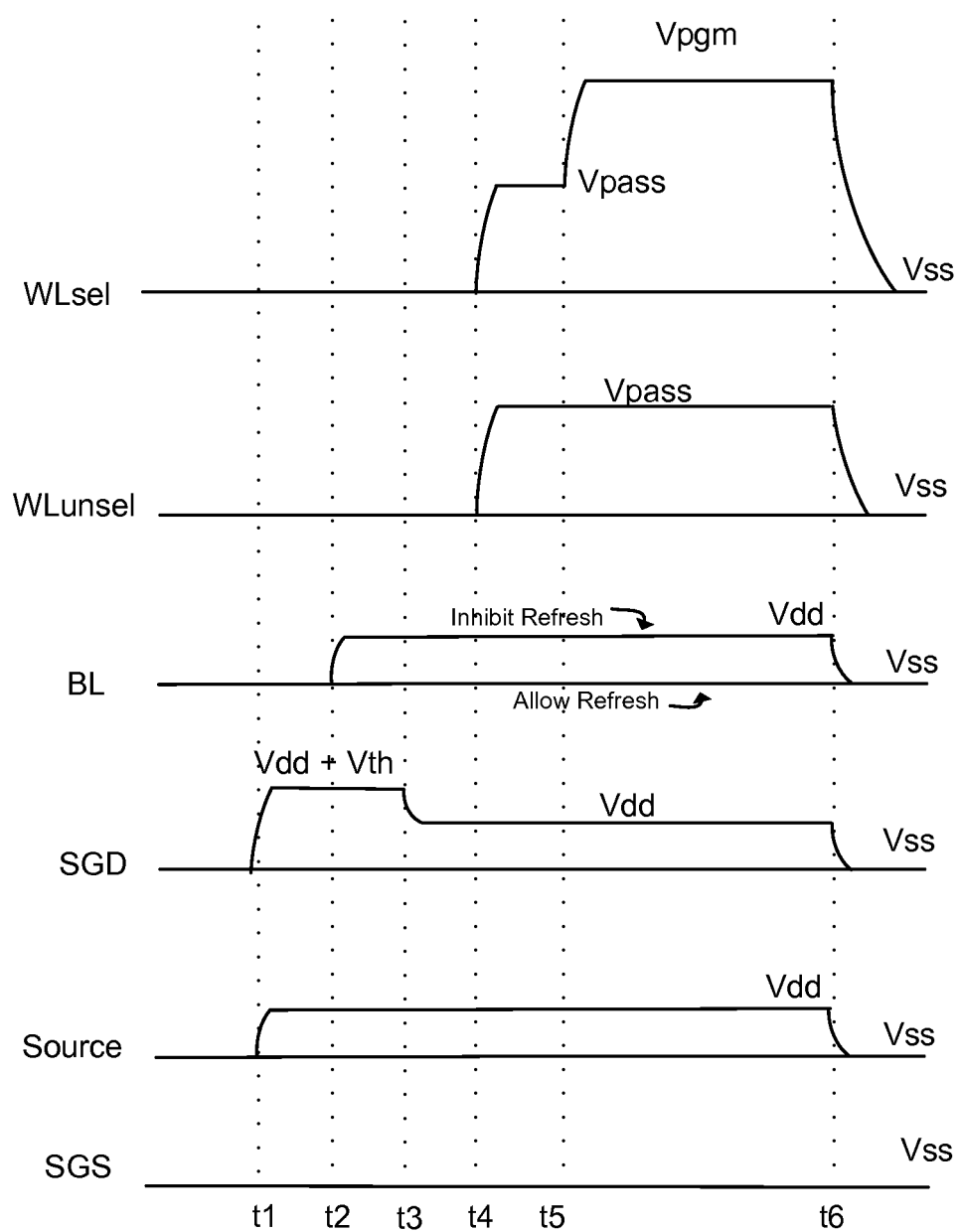
FIG. 38 is a timing diagram showing voltage plotted against time for various signals.

As described above, the refresh operation includes performing one or more program pulses. Whether one program pulse or multiple program pulses is used, will depend upon the design and implementation of the specific memory system. FIG. 38 is a timing diagram depicting the process of applying one program pulse in order to implement all or a portion of steps 904, 932 and 964. If the refresh operation includes multiple program pulses, then the process of FIG. 38 would be performed multiple times during steps 904, 932 and 964.

The timing diagram of FIG. 38 shows voltage plotted versus time for the selected word line WLsel, the unselected word lines WLunsel, the appropriate bit lines BL, the gate signal for the drain side select SGD, the Source line for the block, and the gate signal for the source side select gate SGS. The refresh operation will be performed for all our subset of memory cells connected to a single common word line, referred to as the selected word line WLsel. All of the other word lines that are not selected are referred to as the unselected word line WLunsel. Since only a subset of the memory cells connected to the selected word line will be refreshed, the bit line voltage is used to determine which memory cells will experience the refresh and which will not. A memory cell (and NAND string) connected to a bit line that is at 0 volts will be refreshed in response to a program pulse while a memory cell (and NAND string) connected to a bit line that is at Vdd (2.5-3 volts) will be inhibited from the refresh operation.

At time t1 of FIG. 38, the source line will be raised to Vd and the gate signal at the drain side select gate SGD will be raised to Vdd+Vth (where Vth is the threshold voltage of the drain side select gate). At time t2, those bit lines connected to NAND strings with the memory cells selected for refresh will remain at 0 volts (Vss) while those bit lines connected to NAND strings with no memory cells selected for refresh will be inhibited from refresh by raising the respected bit line to Vdd. At time t3, the gate signal at the drain side select gate SGD is lowered to Vdd. At time t4, the selected word line WLsel and the unselected word lines WLunsel are raised to Vpass (e.g. ~7 to 10 volts). At time t5, the selected word line is raised to the program voltage Vpgm (e.g. 16-20 volts). Between time t5 and t6, the memory cells that are supposed to be refreshed will experience the program pulse (Vpgm). At time t6, all the depicted signals are brought down to Vss.

Because the program voltage is applied to all memory cells connected to the word line, an unselected memory cell (e.g. inhibited from refresh) on the word line (especially adjacent to a selected memory cell) can risk being inadvertently refreshed. This is referred to as "program disturb." The technique used to prevent program disturb in FIG. 38 is referred to as "self boosting." The process of self boosting includes having the unselected bit lines electrically isolated and a pass voltage (Vpass) applied to the unselected word lines during programming. The unselected word lines couple to the unselected bit lines, causing a voltage to exist in the channel of unselected NAND strings, which tends to reduce the program disturb. Self-boosting causes a voltage to exist in a channel which tends to lower the voltage across the tunnel oxide and hence reduce program disturb.

Self boosting mode can be used here instead of EASB (Erased Area Self Boosting), as in MLC operations, so that word lines can be programmed in any order, rather than generally from source side to drain side.

Partial Block Operations

Memory is typically arranged in blocks, where the whole block is erased together. In order to reduce the die size, the block size has increased steadily from 512 k to 4 MB. As more parallel operations are used by the memory system to increase programming performance, the block size will likely further increase. One problem with large block sizes is that to make small changes to a large block of memory requires erasing and reprogramming the entire block, which can be very time consuming. Such system behavior prevents flash memory from being used as RAM or short term memory for many applications.

Figure 39:
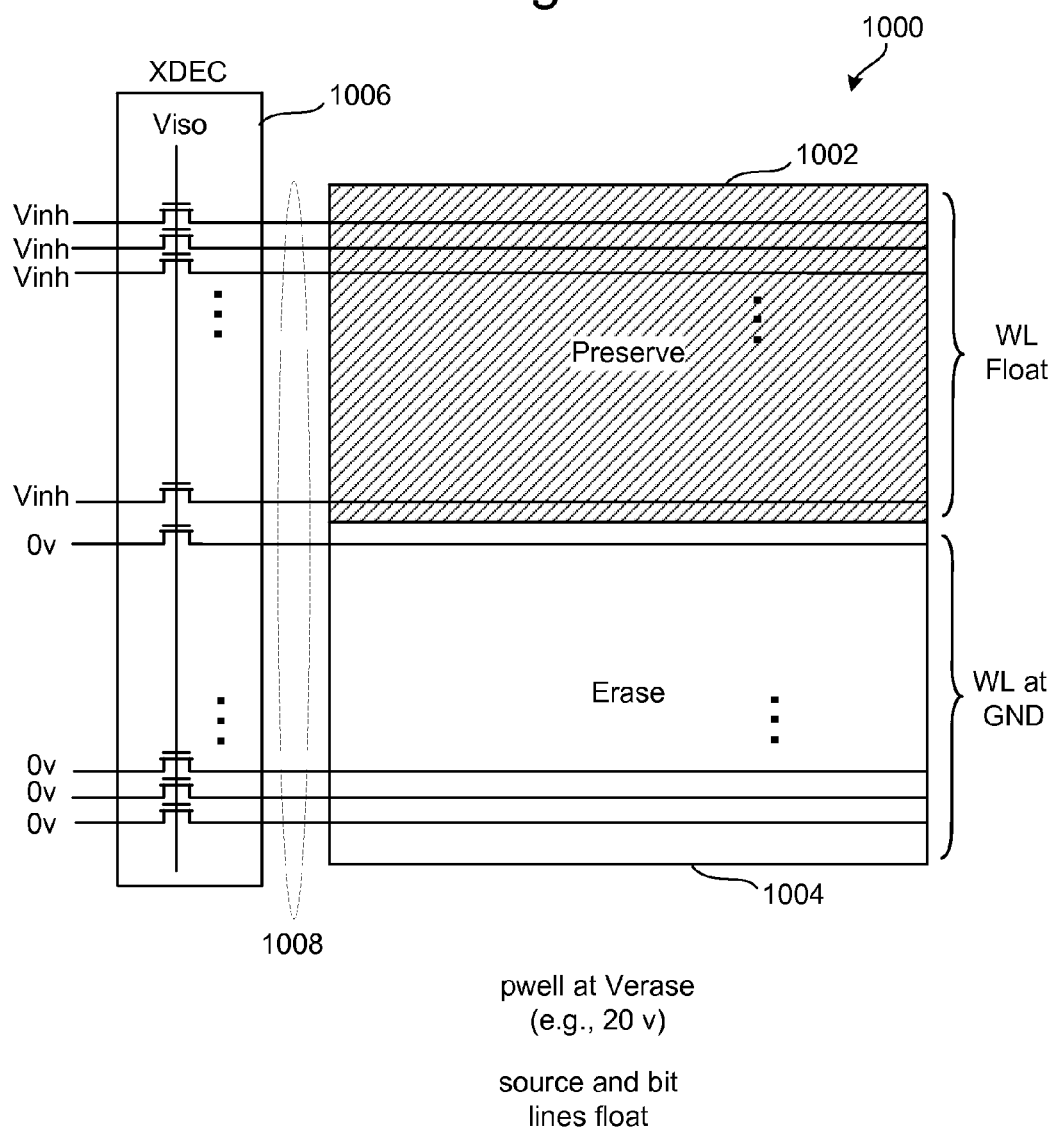
FIG. 39 is a block diagram depicting a portion of a memory array and word line decoder and drivers.

To remedy the above-described issues, it is proposed to perform partial block operations where a portion of a block can be programmed and/or erased while preserving the remainder of the block. FIG. 39 shows an example block 1000 divided into two portions: portion 1002 and portion 1004. In one embodiment, the two portions 1002 and 1004 are each half of block 1000. However, in other embodiments the portions do not need to be equal halves. To explain how a partial block erase will be performed, it is assumed that block 1000 has been fully programmed, it is desired to erase portion 1004 while preserving (e.g. not erasing) the data of portion 1002. FIG. 29 shows portion 1002 as being shaded to indicate that it will not be part of the partial block erase and its data will be preserved. As discussed above, erase are operations performed by applying an erase voltage Verase (e.g., 20 volts) to the p-well, floating the source line, and floating the bit lines. The portion of the block that is to be erased will have its word lines at ground. The portion of the block to be preserved will have its word lines floated. FIG. 39 shows a subset of the word lines 1008, indicating that the word lines in portion 1002 are floating while the word lines portion 1004 are at ground.

FIG. 39 shows word line decoder and drivers 1006, which includes a set of drivers (depicted as FETs). Each of the word lines is connected to the drain side of one of the drivers. The gate of the drivers all receive the isolation voltage Viso, which is a low voltage above zero. In one embodiment, Viso is equal to 2.5 volts; however, lower voltages than 2.5 volts can also be used. The source side of the drivers are connected to an inhibit voltage Vinh for the word lines of portion 1002. This source side of the drivers are connected to ground (0 v) for the drivers connected to word lines of portion 1004. As the p-well is driven to the erase voltage Verase, the drivers having zero at the source side will provide a path to dissipate the charge and keep the word lines at ground. In one embodiment, the inhibit voltage Vinh is equal to the isolation voltage Viso. In other embodiments, the inhibit voltage Vinh is slightly higher than the isolation voltage Viso. Initially the word lines of portion 1002 will be charged to Viso−Vth, as the p-well rises to Verase. When the voltage on the word lines in portion 1002 reaches Viso−Vth, the drivers will cut off, thereby floating the word lines. With the word lines floated, and somewhat coupled to the P well, there will not be a large enough differential in voltage for the memory cells of portion 1002 to erase. On the other hand, there could be a 20 volt differential for the memory cells of portion 1004, thereby allowing erase to be performed.

FIG. 40, which depicts, block 1000, is used to show an example of programming a partial block. For this example, it is also assumed that portion 1004 will be programmed, while the data for portion 1002 will be preserved. FIG. 40 shows word lines 1040, 1042, 1044, 1046, 1048, 1050 and 1052 of portion 1002. FIG. 40 shows word lines 1054, 1056, 1058, 1060, 1062, 1064, and 1066 of portion 1004. Word line 1052 of portion 1002 is referred to as a border word line because it is the word line at the edge of portion 1002 closest to portion 1004 (at the border between portions 1002 and 1004). Similarly, word line 1054 is also a border word line as it is the last word line of portion 1004 and is located at the border of portion 1002 and portion 1004. FIG. 40 only shows a subset of the word lines of each portion of the block, as indicated by the ellipses. Note that portion 1002 is shaded to indicate that its data is being preserved while portion 1004 is shown not being shaded to indicate that it will undergo the memory operation.

To perform the partial block programming, all the word lines in the portion of the block that is to be preserved will receive the isolation voltage Viso. The word line currently being programmed will receive the program voltage Vpgm, which includes the program pulses discussed above. Word lines on the drain side of the selected word line will receive Vpass. The neighbor word line on the source side of the selected word line will also receive Vpass. The remaining word lines on the source side of the selected word line, in the portion of the block selected for programming, will receive the isolation voltage Viso. Note that the drain side of a selected word line is the portion of the block closest to the bit line (toward portion 1002) and the source side is that side closest to the source line (toward portion 1004).

FIG. 41 shows block 1000, with partial block programming being performed on portion 1002 while the data in portion 1004 is perserved (as indicated by the shading of portion 1004). All of the word lines of portion 1004 will receive the isolation voltage Viso. Similar to FIG. 40, the selected word line will receive the program voltage Vpgm. The source side neighbor word line of the selected word line will receive Vpass, and all of the other word lines on the source side of the selected word line within the portion selected for programming will also receive the isolation voltage Viso. Those word lines on the drain side of the selected word line will receive Vpass. Thus, the embodiments of FIG. 40 and FIG. 41 perform a type of self boosting which is localized to a portion of the NAND string due to the isolation voltage Viso attempting to cut off or slow down the boosting for a portion of the relevant NAND strings.

FIGS. 40 and 41 assume that the block is divided into two portions. However, a block can be divided into any number of portions including 2, 3, 4, 5, etc. FIG. 42 shows a block divided into three portions: PB-1, PB-2, and PB-3. For example purposes, it is assumed that portion PB-2 will receive programming, while portions PB-1 and PB-3 will have their data preserved (as indicated by the shading). Therefore the word lines 1170, 1172 and 1174 in PB-1 will receive the isolation voltage Viso. Additionally, the word lines 1094, 1096 and 1098 in PB-3 will also receive the isolation voltage Viso. The word line 1082, which is selected for programming, will receive the program voltage Vpgm. This source side neighbor, word line 1084, will receive Vpass. Other word lines on the source side of word line 1082 that are in PB-2 will receive the isolation voltage Viso. Word lines on the drain side of the selected word line 1082 in PB-2 (such as word lines 1076 and 1080) will receive the pass voltage Vpass. In the embodiment of FIG. 42, word line 1074 is a border word line for PB-1, word line 1094 is a border word line for PB-3, and word lines 1076 and 1092 are border word lines for PB-2.

In one embodiment, word lines are programmed from source side to drain side. The partial block erase and partial block program operations can be used on the Low Endurance Long Retention memory (e.g., the structure of FIG. 3) or the High Endurance Short Retention memory (e.g., the structure of FIG. 4). Memory operations depicted in FIGS. 39-42 can be used as part of the programming operations of any of FIGS. 16-25. Note, when implementing the programming process of FIG. 18A-E, using partial block programming, after the step of programming to the intermediate threshold voltage distribution IM (see FIG. 18B) for a first word line, that same first phase of programming will be performed on a neighbor word line prior to completing the programming of FIGS. 18A-18E on the first word line.

Figure 43:
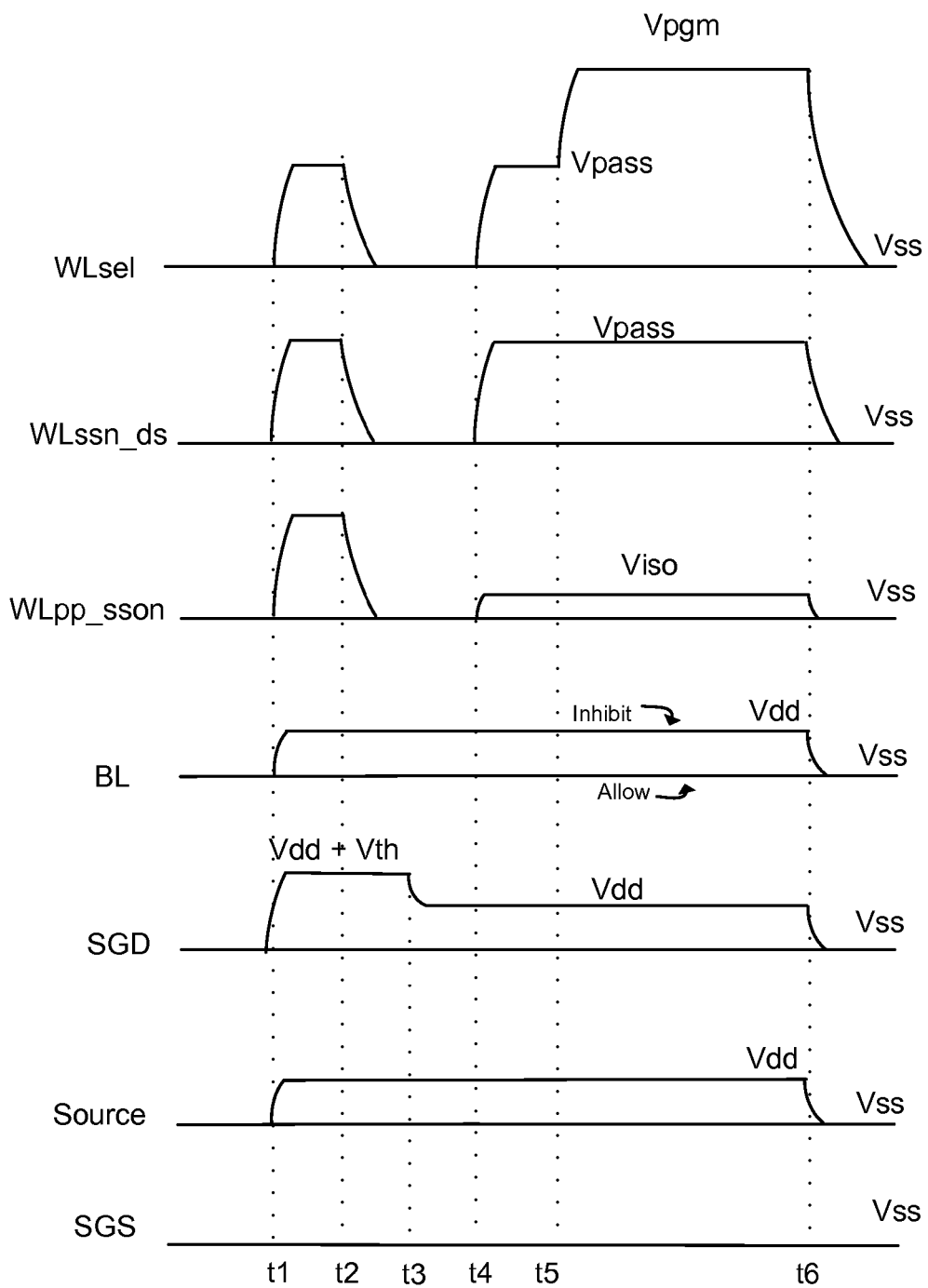
FIG. 43 is a timing diagram showing voltage plotted against time for various signals.

FIG. 43 is a timing diagram showing various signals during the program operations depicted in FIGS. 39-42. The process depict FIG. 43 can be performed many times during a program process. For example, the process depicted in FIG. 43 can be performed as part of step 572 of FIG. 20 (for Low Endurance Long Retention memory cells as well as for High Endurance Short Retention memory cells) or any of steps 640-644 of FIG. 24. Even though FIG. 20 was discussed above to be performed for the Low Endurance Long Retention memory cells, the process of FIG. 20 can be used to program High Endurance Short Retention memory cells using the operation depicted in FIG. 43. FIG. 43 shows voltage versus time for the selected word line (WLsel), the source side neighbor to the selected word line and unselected word lines on the drain side (WLssn_ds), the voltage on the word lines in the portions preserving data and word lines of the selected portions on the source side other than the neighbor word line (WLpp_sson), bit lines BL, gate signal for the drain side select gate SGD, the Source signal, and the gate signal for the source side select gate SGS.

At time t1, all the word lines will be raised to Vpass or a different voltage as part of an effort to pre-charge the NAND strings and bit lines. At the same time, the bit line connected to NAND strings that should be inhibited from programming will be raised to Vdd and SGD will be raised to Vdd+Vth. The Source line will be raised to Vdd and SGS will remain at Vss. Between time t1 and time t2, the NAND string will be pre-charged. At time t2, the word lines will be dissipated to Vss. At time T3, SGD will be lowered to Vdd. At time t4, the selected word line (WLsel), as well the source side neighboring word line and word lines on the drain side (WLssn_ds) are raised to Vpass. Also at time t4, those word lines in portions to have their data preserved and word lines that are on the source side with respect to the selected word line (WLpp_sson) are raised to Viso. From t4 to t5, the NAND string channels will be boosted. At time t5, the selected word line WLsel is raised to the program voltage Vpgm. The period between t5 and t6 is the application of one program pulse. At time t6, all of the signals are brought down to Vss.

Figure 44:
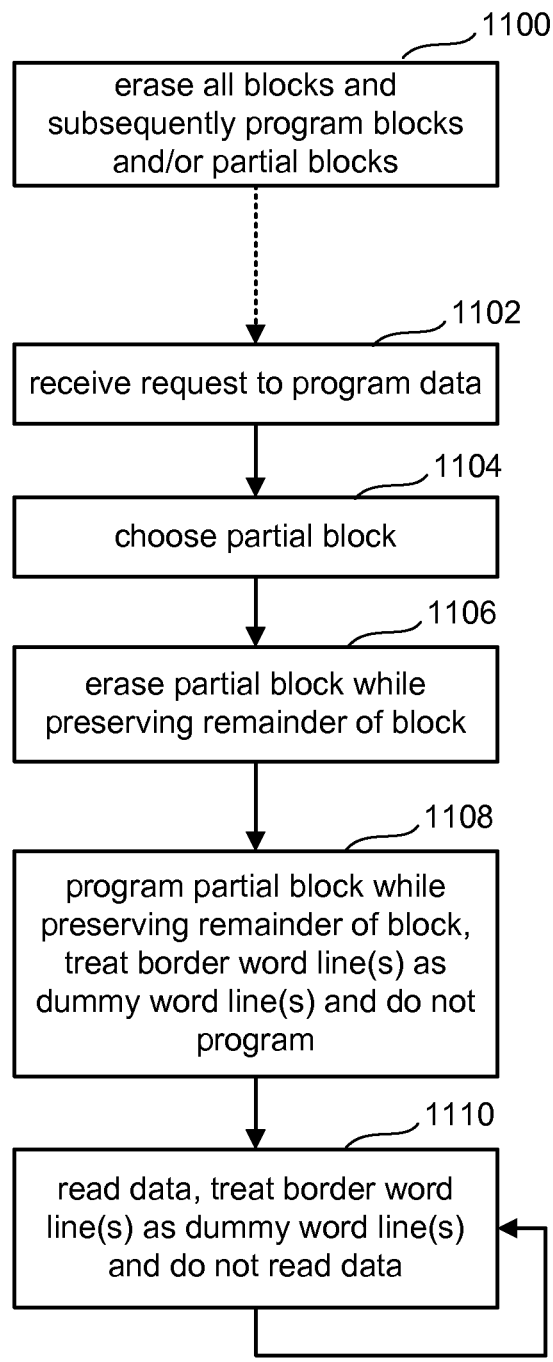
FIG. 44 is a flow chart describing one embodiment of the operation of partial block erasing and programming.

FIG. 44 is a flow chart describing one embodiment of the operation of partial block erasing and programming, as described above. In step 1100, all the blocks (or a subset of all the blocks) are erased. In one embodiment, step 1110 is performed when the memory system is manufactured, formatted and/or first used. Step 1100 also includes subsequently programming one or more blocks in their entirety or one or more partial blocks. The line between step 1100 and 1102 is dashed to indicate that steps will not necessarily happen right after each other, as much time could pass. In step 1102, a request is received to program data. In one example, a small amount of data in a block is requested to be reprogrammed. Rather than erase and reprogram an entire block, the partial block programming process will be performed. In step 1104, the system will choose which partial block needs to be reprogrammed based on where the data being replaced is currently stored. In step 1106, a partial block erase process is performed while preserving the remainder of the block. In one example, the process depicted in FIG. 39 will be performed in step 1106. In step 1108, a partial block programming process is performed while the remainder of the block is preserved. In step 1110, the data can be read from the block or a portion of the block.

In one embodiment, programming or erasing part of a block may cause some disturb in the other part of the block being preserved. The disturb will be most notable at the border word lines. In one embodiment, to overcome the disturb at the border word lines, the system will operate the border word lines as dummy word lines. By dummy word lines, it is meant that no data is stored. In one example implementation, the system will never program the dummy word lines. In other embodiment, the system will program the dummy word lines with a random pattern, predetermined pattern (but not user data), or just intermediate state conditions. Thus, when the partial block program is performed in step 1108, no data is programmed to the border word lines as they are dummy word lines. In this embodiment, when a read process is performed, the border word lines will not be read.

Operating the border word lines as dummy word lines reduces the amount of data that can be stored in the block. Another alternative to combat disturb at the border word lines is to read out the border word lines before a partial memory operation and then reprogram the border word lines afterwards. FIGS. 45 and 46 depict two embodiments of processes that perform partial memory erase/programming, including reading out the border word lines prior to such an operation.

In step 1148 of FIG. 45, all blocks are erased and subsequently programmed. Step 1148 is analogous to step 1100 of FIG. 44. There is a dotted line between steps 1148 and 1150 to indicate that these two steps may be separated by a large and unpredictable amount of time. In step 1150, a request to program data is received that is requesting a small amount of data be replaced. Rather than program an entire block, it is desired to perform a partial block erase and program. The appropriate block is chosen in step 1152 based on where the current data is being stored. In step 1154, data from the border word lines for the portions of the block being preserved are read out from the memory array. That data read out from the border word lines is stored in step 1156. The data can be stored in another block of flash memory (e.g. High Endurance Low Retention binary memory) or in the Controller. In step 1158, the chosen partial block is erased, as depicted above with respect to FIG. 39. One exception is that the border word line (which is in the portion of the block to be preserved) will experience a weak erase. To experience a weak erase, the source line of the word line driver for the border word line can be driven with a voltage that is half the amount of Vinh (see FIG. 39) or one volt (another low voltage). Since the border word line is not boosted as high as the other word lines in the preserved portion of the block, some erasing is likely to occur by the memory cells on the border word line will not be completely erased. The purpose of this weak erase operation is to provide somewhat of a buffer between the preserved portion of the block and the erasing portion of the block.

In step 1160, a partial block programming operation is performed, as discussed above. In step 1162, the border word lines that were read out in step 1154 are reprogrammed based on the stored data from step 1156. In step 1164, data can be read randomly at any time after step 1162. In some embodiments, to reduce floating gate to floating gate coupling, the process of FIG. 45 may jump back and forth between programming the end word lines of the partial block and the border word lines such that the process includes jumping back and forth between steps 1160 and 1162 (as depicted by the dotted line between steps 1160 and 1162.

FIG. 46 is a flow chart describing another embodiment of a process that performs partial memory erase/programming, including reading out the border word lines prior to the partial block operations. Steps 1180-1190 of FIG. 46 are the same as steps 1148-1158 of FIG. 45. In step 1192 of FIG. 46, the border word lines are reprogrammed. Step 1192 is similar to step 1162 of FIG. 45. In step 1194, a partial block programming operation is performed. In step 1196, data is read randomly and at any time after step 1194. The difference between the process of FIG. 46 and the process of FIG. 45, is that in FIG. 45 the border word lines are programmed after the partial block programming while in FIG. 46 the border word lines are programmed prior to the partial block programming operation. In either case, the border word lines are programmed after the partial block erase in order to avoid disturb associated with the erase. One situation for using the process of FIG. 46 (instead of the process of FIG. 45) is when dummy word lines are on the source side as compared to the portion of the block being reprogrammed. Some read processes may to take into account floating gate to floating gate coupling, including assuming that word lines are programmed from source side to the drain side. To accommodate such assumptions by the read process, it may be necessary to program the border word lines prior to the partial block when the partial block is on the drain side with respect to the border word lines.

The memory system can be implemented without a fixed number of partitions within a block. The system can use different configurations as needed, with a change in configuration causing a redefining of which word lines are border word lines. For example, a memory system designed such that each block is broken up into 2, 4, 5, 8, etc. partial blocks. Alternatively, a memory system can be designed such with blocks partitioned into units of 8 (or a different number of) word lines. The system can use 1, 2 or 3 times the unit size (or a different number) for partial blocks. The system can decide to use only 8 word line partial blocks. Alternatively, the system can choose to use 16 word line partial blocks or 24 word line partial blocks (or a different number) as a unit to reduce the border word line capacity. This configuration can be done at the factory during manufacturing or on the fly by a smart Controller. The system can also take the redefine the partial block size as needed. For example, sometimes an 8 word line partial block can be used and sometimes a sixteen (or different number) word line partial block can be used.

The processes of FIGS. 44-46 can be performed by the Controller, by the state machine, or by a combination of the state machine and Controller.

Refresh for Partial Block Operations

FIG. 35, discussed above, is a flowchart describing a process for managing refresh for high endurance low retention memory cells. When using partial block erase operations, tracking the number of partial block operations can be an indicator of when a refresh operation should be performed. FIGS. 47 and 48 are flowcharts that describe two embodiments of processes for determining whether it is time to refresh a block (see step 900 of FIG. 35) for systems that use partial block erase.

In step 1250 of FIG. 47, a partial block erase operation is performed for any portion of a block (as described above by any of the embodiments described above). In step 1252, a counter for the block is incremented. In step 1254, it is determined whether the counter is over a particular predefined limit. If not, no refresh needs to be performed (step 1258). If the counter is above a predefined limit, then a refresh operation is performed (step 1256). The refresh operation can be performed as described above with respect to FIGS. 35-37.

FIG. 48 depicts another embodiment for determining when to perform a reset in a system that uses partial block erase. In step 1280, a partial block erase is performed on any portion of any of the blocks in the memory system. In step 1282, one or more counters are incremented. In this embodiment, each portion of the block will have its own counter. Step 282 includes incrementing counters for all preserved portions of the block that underwent the partial block erase. If any of those counters are above the predetermined limit (step 1284) then a refresh operation is performed in step 1286. If none of the counters are over the predefined limit, then no refresh operation is performed (step 1288). Note that when performing the refresh operation in step 1286, a refresh can be performed for the entire block. Alternatively, system can perform a refresh only for the portion(s) of the block that has its counter above the limit. After performing the refresh, the counter would be reset to zero. In another alternative the refresh would be performed only for boundary word lines on the portion of the block that has its counter incremented to be greater than the predefined limit.

In some embodiments, the entire block, the entire portion, or the entire word line is subjected to a refresh. In other embodiment, only those memory cells that need to be refreshed will undergo the refresh operation (see above).

System Applications

Figure 49:
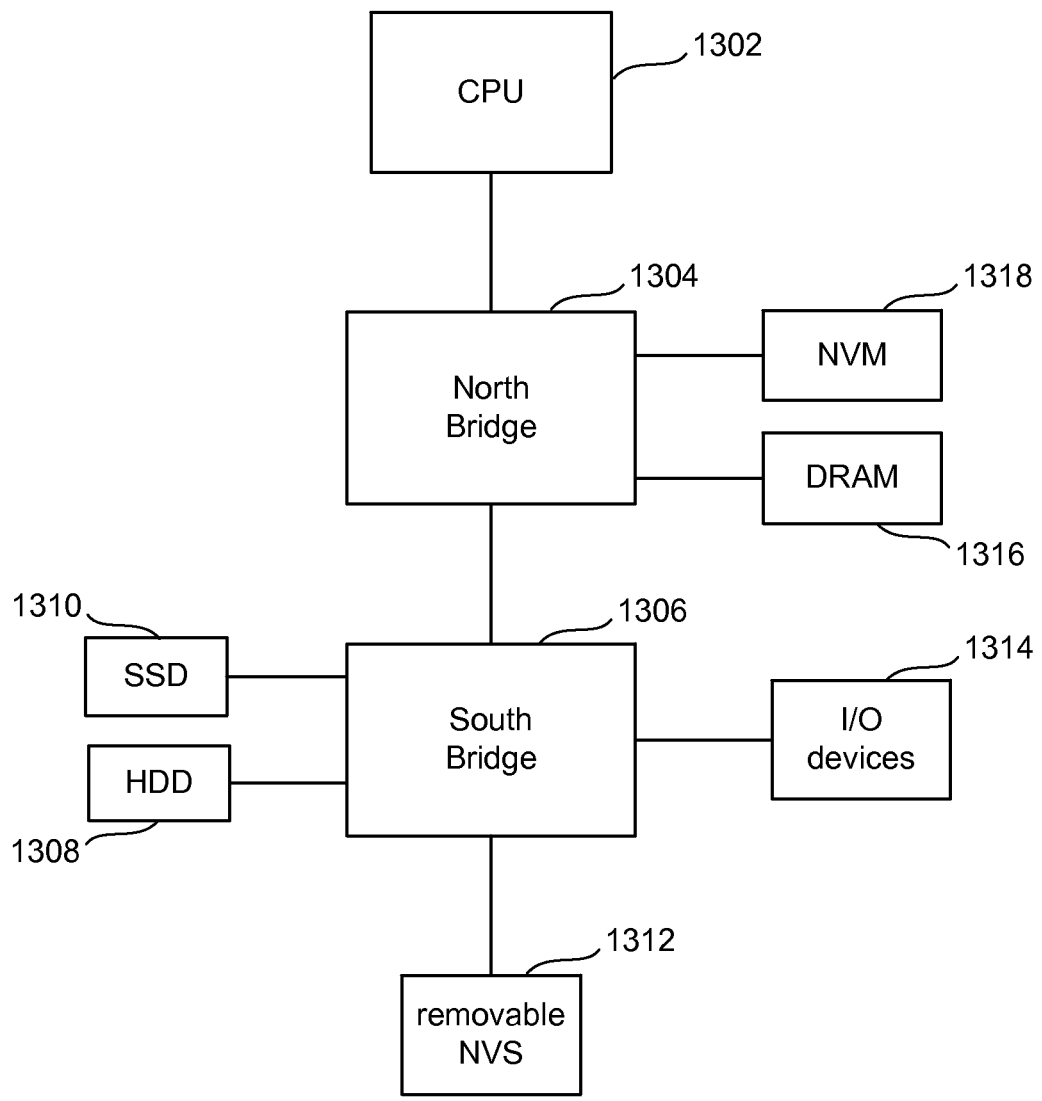
FIG. 49 is a block diagram that shows one example computing system that can include High Endurance Short Retention memory cells and/or Low Endurance Long Retention memory cells.

The above discussion provides different embodiments of systems that comprise High Endurance Short Retention memory cells, Low Endurance Long Retention memory cells, and/or a combination of both. FIG. 49 shows one example computing system that can include High Endurance Short Retention memory cells and/or Low Endurance Long Retention memory cells. The computing system of FIG. 49 includes a central processing unit 1302 in communication with Northbridge 1304, which is in communication with Southbridge 1306. For more information, see U.S. Pat. No. 7,716,411: Hybrid Memory Device With Single Interface.

Generally, Northbridge 1304 and Southbridge 1306 provide data that is between specific sets of bus peripherals. Northbridge 1304 handles the more data intensive pathways such as the memory and graphics buses, while Southbridge 1306 takes care of secondary connections such as disk drives and USB peripherals. There is typically a strict division of duties between Northbridge 1304 and Southbridge 1306, as well as a high speed interface between the two. In the example of FIG. 49, Southbridge 1306 is connected to hard disk drive 1308, solid state drive 1310, removable non-volatile storage system 1312, and input/output devices 1314. Solid state drive 1310 can be a flash memory system using any of the combinations of High Endurance Short Retention memory cells and Low Endurance Long Retention memory cells described herein. Removable non-volatile storage system 1312 can be a removable memory card (e.g. SD card, compact flash card, etc.) using any of the combinations of High Endurance Short Retention memory cells and Low Endurance Long Retention memory cells described herein.

Northbridge 1304 is connected to DRAM 1316 and non-volatile memory 1318. In one embodiment, DRAM 1316 is system memory. Non-volatile memory 1318 can also be operated as system memory. In one embodiment, non-volatile memory 1318 comprises High Endurance Short Retention memory, as described herein. In other embodiments, non-volatile memory 1318 can include a combination of High Endurance Short Retention memory and Low Endurance Long Retention memory, as described herein.

Figure 50A:
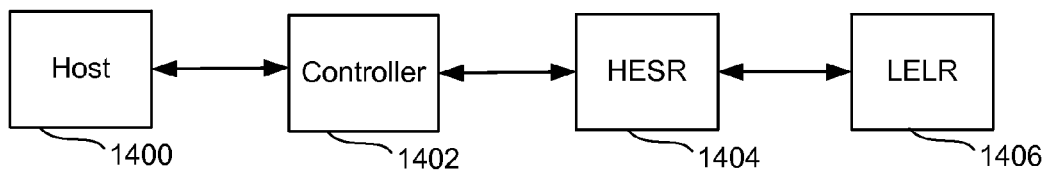
FIGS. 50A-D are block diagrams depicting various embodiments for configuring High Endurance Short Retention memory and Low Endurance Long Retention memory.

FIGS. 50A-D are diagrams depicting various embodiments for configuring High Endurance Short Retention memory and Low Endurance Long Retention memory to implement any of non-volatile memory 1318, removable non-volatile storage 1312 and solid state drive 1310 of FIG. 49. In the embodiment of FIG. 50A, the High Endurance Short Retention memory 1404 serves as a cache for Low Endurance Long Retention memory 1406. Therefore, FIG. 50A shows host 14 in communication with controller 1402, which is in direct communication with High Endurance Short Retention memory 1404. FIG. 50A shows High Endurance Short Retention memory 1404 between Controller 1402 and Low Endurance Long Retention Memory 1406 to symbolically show that High Endurance Short Retention memory 1404 is a cache (or buffer). However, Controller 1402 is likely to have direct connections to Low Endurance Long Retention memory 1406.

Figure 50B:
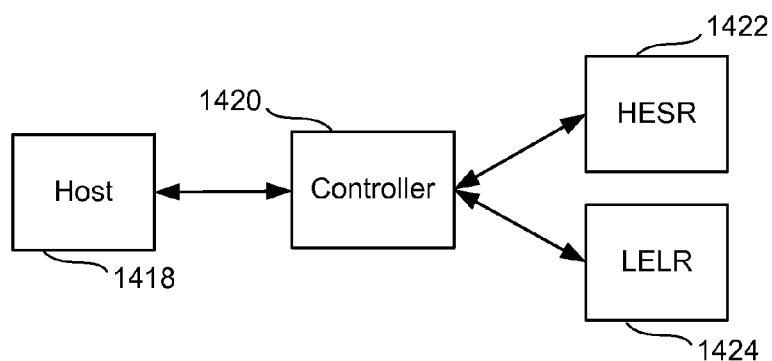

FIG. 50B shows a memory system where Controller 1420 will store short term data in High Endurance Short Retention memory 1422 and long term data in Low Endurance Long Retention Memory 1424. FIG. 50B also shows Host 1418 in communication with Controller 1420.

Figure 50C:
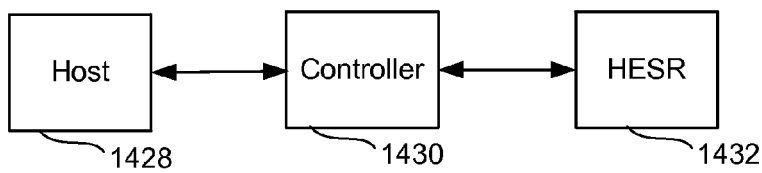

FIG. 50C shows a memory system that only includes High Endurance Short Retention memory 1432. The system does not include any Low Endurance Long Retention memory. High Endurance Short Retention memory 1432 is in communication with Controller 1430, which is in communication with Host 1428. In one example, the memory system of FIG. 50C can be used to implement system memory to replace DRAM or other types of volatile memory.

Figure 50D:
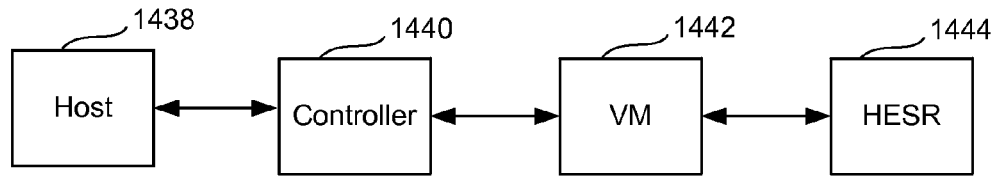

The embodiment of FIG. 50D utilizes High Endurance Short Retention memory 1444 in order to provide long term storage for volatile memory 1442. One example of volatile memory 1442 is DRAM. Controller 1440 will communicate with Host 1438, as well as both volatile memory 1442 and High Endurance Short Retention memory 1444.

In the embodiments of FIGS. 50A-D, the various Hosts can be Northbridge 1304, Southbridge 1306 or other devices, as appropriate. In some embodiments, the Host could have built in Controllers, removing the need for the separate Controller depicted in FIGS. 50A-50D. The examples of High Endurance Short Retention memories depicted in FIGS. 50A-D can be any of the structures described above and can be operated using any of the processes described above. For example, any of the High Endurance Short Retention memory described in FIGS. 50A-D can be implemented using the thinner floating gates, thinner tunnel oxide, wider pitch, phase sensing, refresh operations, and partial block operations described above.

Each of the features described above can be used separately or together in various combinations.

One embodiment includes a method for operating non-volatile storage system, comprising: applying one or more programming pulses to a first non-volatile storage element to intentionally saturate a floating gate of the first non-volatile storage element with electrons in order to program data into the first non-volatile storage element.

In some embodiments, the floating gate includes nanodots to limit the number of electrons in the floating gate and/or the applying the one or more programming pulses comprises applying multiple programming pulses to the first non-volatile storage device without any intervening verify operations for the first non-volatile storage element.

In some embodiments, the one or more programming pulses are applied to a first set of non-volatile storage elements via a common control line to intentionally saturate floating gates of the multiple non-volatile storage elements with electrons in order to program first data into the first set of non-volatile storage elements, the first set of non-volatile storage devices includes the first non-volatile storage device. In some examples, the non-volatile storage system includes a second set of non-volatile storage elements such that the method further comprises applying one or more programming pulses to the second set of non-volatile storage elements to program the second set of non-volatile storage devices with second data without intentionally saturating floating gates of the second set of non-volatile storage elements; the first set of non-volatile storage elements are used to store binary data; the first set of non-volatile storage elements have smaller floating gates than the second set of non-volatile storage elements; the second set of non-volatile storage elements have wider floating gate stacks than the first set of non-volatile storage elements; the first set of non-volatile storage elements are connected to a first word line, the second set of non-volatile storage elements are connected to a second word line and the first word line is wider than the second word line. For example, at least one non-volatile storage element of the first set of non-volatile storage elements and at least one non-volatile storage element of the second set of non-volatile storage elements are on a common NAND string.

In some embodiments, the first set of non-volatile storage elements are part of a block of non-volatile storage elements and the method further comprises determining whether to refresh the first set of non-volatile storage elements and refreshing at least a subset of the first set of non-volatile storage elements without copying all of the block of non-volatile storage elements. The block of non-volatile storage elements includes a first portion of the block and a second portion of the block, dummy non-volatile storage elements are positioned between useful non-volatile storage devices of the first portion and the second portion, and the method further comprises: erasing the first portion of the block of non-volatile storage elements without erasing the second portion of the block of non-volatile storage elements and keeping track of how many times the first portion of the block has been erased separately from keeping track of how many times the second portion of the block has been erased, the determining whether to refresh the first set of non-volatile storage elements is based on how many times the first portion of the block has been erased. Alternatively, the method can include erasing the first portion of the block of non-volatile storage elements without erasing the second portion of the block of non-volatile storage elements and keeping track of how many times any portion of the block has been erased, the determining whether to refresh the first set of non-volatile storage elements is based on how many times any portion of the block has been erased.

One embodiment includes a non-volatile storage apparatus that comprises a first set of non-volatile storage elements having a first pitch, a second set of non-volatile storage elements having a second pitch, and one or more control circuits in communication with the first set of non-volatile storage elements and the second set of non-volatile storage elements.

One embodiment includes a method for operating a non-volatile storage system, comprising programming a block of non-volatile storage elements, waiting at least a predetermined amount of time, determining whether the block of non-volatile storage elements need to be refreshed, and refreshing a subset of the block of non-volatile storage elements without refreshing all of the block of non-volatile storage elements and without copying all of the block of non-volatile storage elements.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

We claim:

1. A method for operating a non-volatile storage system, comprising:
  applying one or more programming pulses to a first non-volatile storage element of a first set of plural non-volatile storage elements each having a floating gate structured to have a limited charge absorbing capability irrespective of increase of voltage of programming pulses such that it can be saturated by electrons transferred to it from a channel of the storage element without becoming over programmed, wherein the applied one or more programming pulses cause the floating gate of the first non-volatile storage element to be saturated by electrons transferred to it from the channel of the first non-volatile storage element to thereby program the first non-volatile storage element without over programming the first non-volatile storage element;
  wherein the system includes a second set of plural non-volatile storage elements each having a corresponding second floating gate that is thicker than the first said floating gate of each of the storage elements of the first set.

2. The method of claim 1, wherein:
the floating gates of the first set of plural non-volatile storage elements each includes nanodots which cause the floating gates to be structured so as to have a reduced number of electrons that can be absorbed by the floating gates as compared to same-sized floating gates but without the nanodots.

3. The method of claim 1, wherein:
the applying the one or more programming pulses to the first non-volatile storage element so as to saturate the floating gate thereof consists of applying multiple programming pulses without any intervening verify operations between the multiple programming pulses.

4. The method of claim 1, wherein:
the one or more programming pulses are applied to the first set of plural non-volatile storage elements via a common control line.

5. The method of claim 4, the method further comprising:
applying one or more programming pulses to the second set of plural non-volatile storage elements to thereby program one or more corresponding second non-volatile storage elements of the second set of plural non-volatile storage devices wherein floating gates of the second set of plural non-volatile storage elements are never saturated by electrons transferred to those floating gates as a result of the one or more programming pulses applied to the second set of plural non-volatile storage elements, said saturation by electrons being one where there is no more room for a substantial amount of additional threshold changing electrons irrespective of increase of voltage of programming pulses applied to the second set of plural non-volatile storage elements.

6. The method of claim 5, wherein:
the second set of plural non-volatile storage elements can each be programmed with different amounts of charge for defining more than two data representing states without saturating the second floating gates of the second set of plural non-volatile storage elements.

7. The method of claim 6, wherein:
the floating gates of the second set of plural non-volatile storage elements are structured to have respective second charge absorbing capabilities greater than those of the floating gates of the first set of plural non-volatile storage elements.

8. The method of claim 6, wherein:
the second set of plural non-volatile storage elements have respective channels that are shorter than those of the first set of plural non-volatile storage elements.

9. The method of claim 6, wherein:
at least a two among the first set of plural non-volatile storage elements are connected to a first word line;
at least a two among the second set of plural non-volatile storage elements are connected to a second word line;
the first word line is wider than the second word line.

10. The method of claim 6, wherein:
the first non-volatile storage element overlaps a plurality of bit lines; and
a non-volatile storage element among the second set of plural non-volatile storage elements overlaps only one bit line.

11. The method of claim 6, wherein:
at least one non-volatile storage element of the first set of non-volatile storage elements and at least one non-volatile storage element of the second set of non-volatile storage elements are on a common NAND string.

12. The method of claim 4, wherein the first set of plural non-volatile storage elements are part of a block of non-volatile storage elements storing data, the method further comprising:
determining whether to refresh the stored data of the first set of plural non-volatile storage elements; and
refreshing at least a subset of the first set of plural non-volatile storage elements without copying all of the stored data of all of the block of non-volatile storage elements;
wherein the refreshing includes applying one or more programming pulses to the subset of the first set of plural non-volatile storage elements while selectively applying different voltages to bit line portions of the subset of the first set of plural non-volatile storage elements that are subject to the programming pulses of said refreshing.

13. The method of claim 12, wherein the block of non-volatile storage elements includes a first portion and a second portion, wherein dummy non-volatile storage elements are positioned between useful non-volatile storage devices of the first portion and of the second portion, the method further comprising
erasing the first portion of the block without erasing the second portion of the block; and
keeping track of how many times the first portion of the block has been erased separately from keeping track of how many times the second portion of the block has been erased, the determining whether to refresh the first set of plural non-volatile storage elements is based on how many times the first portion of the block has been erased.

14. The method of claim 12, the block of non-volatile storage elements includes a first portion of the block and a second portion of the block, dummy non-volatile storage elements are positioned between useful non-volatile storage devices of the first portion and the second portion, the method further comprising
erasing the first portion of the block of non-volatile storage elements without erasing the second portion of the block of non-volatile storage elements; and
keeping track of how many times any portion of the block has been erased, the determining whether to refresh the first set of non-volatile storage elements is based on how many times any portion of the block has been erased.

15. The method of claim 4, further comprising reading the first set of non-volatile storage elements by performing a process comprising:
applying a compare voltage to the common control line using a word line driver, the common control line is a word line;
reading a first subset of the first set of non-volatile storage elements closest to the word line driver after a time delay suitable for the first subset but not suitable for a second subset of the first set of non-volatile storage elements further from the word line driver than the first subset of the first set of non-volatile storage elements;
reading the second subset of the first set of non-volatile storage elements after a time delay suitable for the second subset but not suitable for a third subset of the first set of non-volatile storage elements further from the word line driver than the second subset of the first set of non-volatile storage elements; and
reading the third subset of the first set of non-volatile storage elements after a time delay suitable for the third subset.

16. The method of claim 1, wherein the programming of the first non-volatile storage element changes it from being conductive when driven by a control gate voltage of zero volts to requiring a control gate voltage above zero volts to be conductive.

17. The method of claim 1, wherein prior to the programming of the first non-volatile storage element it is in an erased state wherein it needs to be driven by a control gate voltage less than zero volts in order to switch the first non-volatile storage element from being conductive to being nonconductive.

18. The method of claim 1, wherein the second set of plural non-volatile storage elements each has a corresponding second dielectric layer between its respective channel and second floating gate that is thicker than a corresponding first dielectric layer of each of the storage elements of the first set, the first dielectric layer being disposed between the first said floating gate of each of the storage elements of the first set and its respective channel.

19. The method of claim 1, the first said floating gates are not more than half as thick as the second floating gates.

20. A monolithically integrated circuit comprising:
first data storage means for storing only binary data, the first data storage means including a plurality of non-volatile binary state storage elements each having a respective control gate and a respective floating gate of limited charge absorbing capacity where upon reaching a saturated electron state, the capacity of the respective control gate does not increase in response to increase of programming voltage applied to the respective control gate, the respective floating gate being configured to become saturated by electrons transferred to it from a channel of the respective non-volatile binary state storage element; and
second data storage means for storing multibit data, the second data storage means including a plurality of non-volatile multi-state storage elements each having a respective control gate and a respective floating gate, the respective floating gates of the multi-state storage elements being substantially larger than the respective floating gates of the binary state storage elements and thus having a larger charge absorbing capacity for defining more than two programmed states without reaching a saturated electron state; and
a read/write circuit operatively coupled to at least one of the non-volatile Binary state storage elements and configured to perform memory operations thereon including programming of the at least one non-volatile binary state storage element such that the respective floating gate of the at least one non-volatile binary state storage element becomes saturated by electrons transferred to it from the channel of the respective non-volatile binary state storage element.

21. The monolithically integrated circuit of claim 20 wherein the respective floating gates of the binary state storage elements are not more than half as thick as the respective floating gates of the multi-state storage elements.

* * * * *